(12) United States Patent
Nozawa et al.

(10) Patent No.: US 6,723,576 B2
(45) Date of Patent: Apr. 20, 2004

(54) DISPOSING METHOD FOR SEMICONDUCTOR ELEMENTS

(75) Inventors: Ryoichi Nozawa, Tatsuno-machi (JP); Mutsumi Kimura, Suwa (JP); Satoshi Inoue, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/896,818

(22) Filed: Jun. 29, 2001

(65) Prior Publication Data

US 2002/0160546 A1 Oct. 31, 2002

(30) Foreign Application Priority Data

Jun. 30, 2000 (JP) ..................... P2000-199982
Jun. 29, 2001 (JP) ..................... P2001-197800

(51) Int. Cl.[7] .......... H01L 21/00; H01L 21/44; H01L 21/30; H01L 21/302; H01L 21/311
(52) U.S. Cl. .............. 438/30; 438/40; 438/43; 438/67; 438/82; 438/99; 438/113; 438/455; 438/459; 438/665; 438/666; 438/692; 438/693; 438/701; 438/713
(58) Field of Search ............ 438/30, 40, 43, 438/67, 82, 99, 113, 455, 459, 665, 666, 692, 693, 701

(56) References Cited

U.S. PATENT DOCUMENTS

| | | | |
|---|---|---|---|
| 5,545,291 A | * | 8/1996 | Smith et al. ............. 438/107 |
| 5,783,856 A | | 7/1998 | Smith et al. |
| 5,824,186 A | | 10/1998 | Smith et al. |
| 5,904,545 A | | 5/1999 | Smith et al. |
| 6,413,838 B2 | * | 7/2002 | Itoh ..................... 438/462 |
| 6,420,266 B1 | * | 7/2002 | Smith et al. ............. 438/692 |
| 6,468,638 B2 | * | 10/2002 | Jacobsen et al. ......... 428/209 |

* cited by examiner

*Primary Examiner*—John F. Niebling
*Assistant Examiner*—Stanetta Isaac
(74) *Attorney, Agent, or Firm*—Harness, Dickey and Pierce, P.L.C.

(57) ABSTRACT

An active-matrix type organic EL display which uses transistors with less variation of characteristics (transistors in which active layer is a single crystal semiconductor) is made on a large area of a transparent base board at low cost. Plural unit of fine construction are formed on a silicon wafer in rows. This unit includes a driving element (switching transistor 34, driving transistor 37, capacity 36) of organic EL element (pixel) 35. Unit block 39 is produced by dividing this silicon wafer. This unit block 39 is disposed at a predetermined position of glass base board 52 (display base board). The driving element of each pixel 35 is connected by signal line 31, power supply line 32, scanning line 33, and capacity line 38.

25 Claims, 20 Drawing Sheets

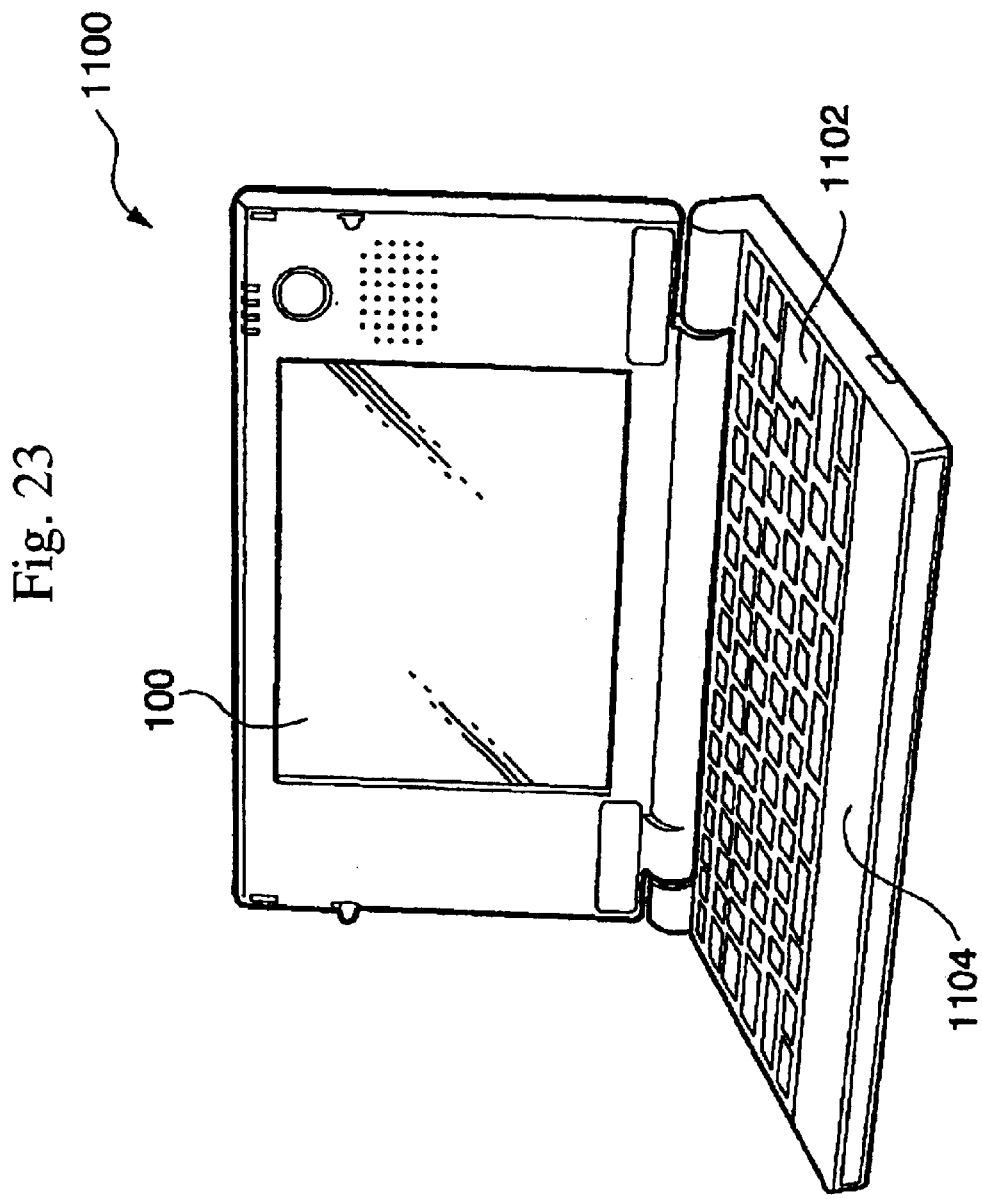

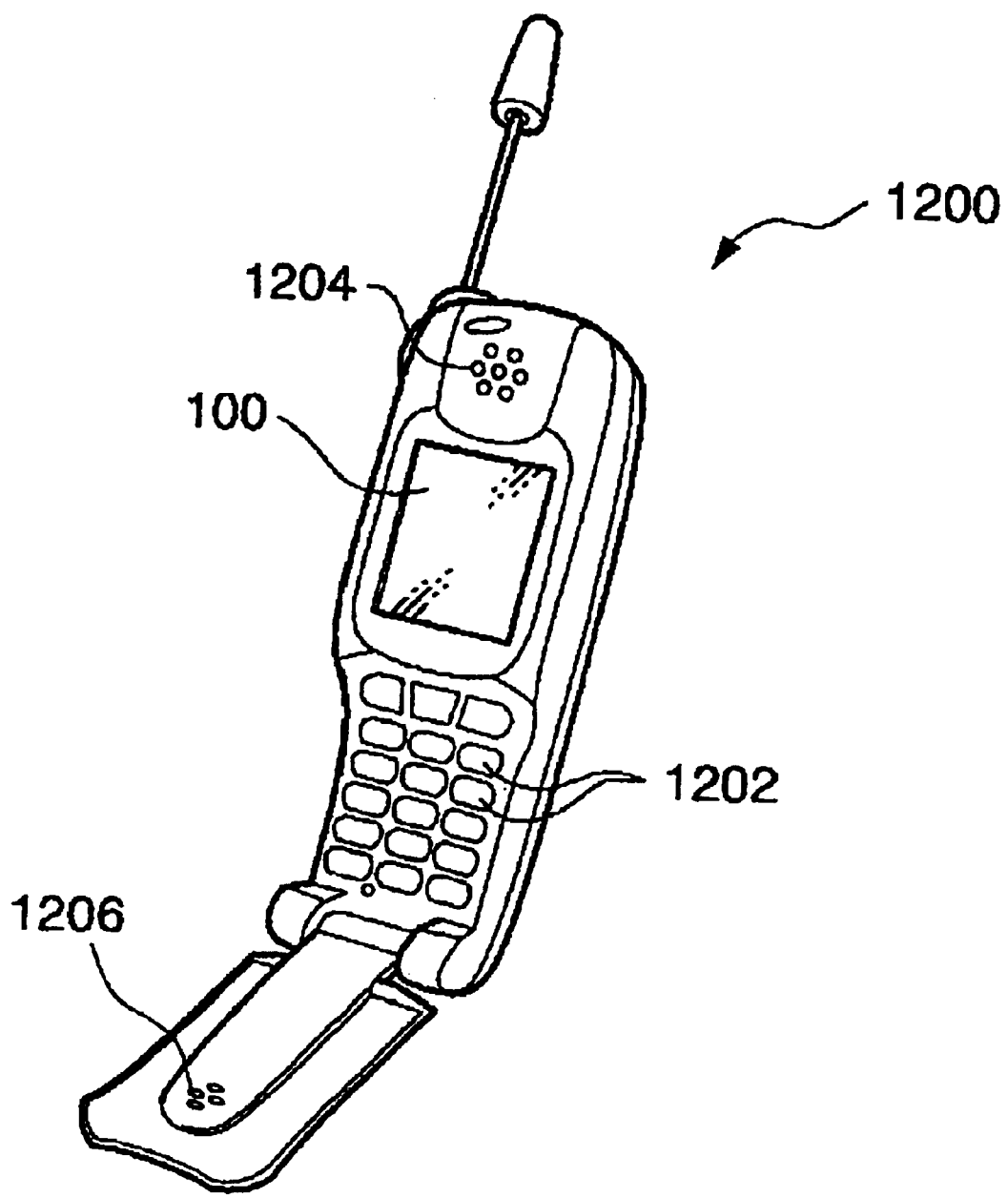

DISPOSING METHOD FOR SEMICONDUCTOR ELEMENTS

BACKGROUND OF THE INVENTION

1. Field of the Invention

The present invention relates to a manufacturing method for organic EL (electroluminescence) displays and to a disposing method for semiconductor elements.

2. Description of Related Art

An organic EL display which is provided with organic EL elements corresponding to pixels is anticipated to replace liquid displays in the future because the display performance is superior and thinner, lighter, more electrically efficient displays are available due to the fact that organic EL elements emit very brightly and emit spontaneously, direct current low voltage driving is possible, response is immediate, and light is emitted by a solid organic film.

In particular, an active-matrix type organic EL display using an active-matrix driving method can be adapted to multi-grading and large displays because of the high brightness and high resolution due to the fact that transistor and capacity are provided in each pixel.

An example of an active-matrix type organic EL display which has been proposed is shown in FIG. 19. This drawing shows one pixel, and a driving element, etc., which are disposed around this one pixel. In this active-matrix type organic EL display, switching transistor 34, driving transistor 37, and capacity 36 are provided for each pixel 35 made of an organic EL element. These elements are connected to a driving circuit by way of signal line 31, power supply line 32, scanning line 33, and capacity line 38. Reference numeral 19 is an electrode of pixel 35. The purpose of using plural transistors is to enhance the reliability by improving off-current, lowering the deterioration of characteristics caused by impressing a voltage on the transistor.

In this active-matrix type organic EL display, a pixel is selected by switching transistor 34, then organic EL element as a pixel 35 emits at predetermined brightness by driving transistor 37. As these transistors, use of a thin film transistor wherein an active layer is a low temperature polycrystal silicon film which can be formed on a glass base board is proposed in order to form an organic EL display on a large area of transparent base board.

Additionally, an organic EL display using the conductance control method (T. Shimoda, M. Kimura, et al., Proc. Asia Display 98, 217; M. Kimura, et al., IEEE Trans. Elec. Dev., 46, 2282 (1999); M. Kimura, et al., Proc. IDW99,171), the control of the intensity of brightness of an organic EL element is performed by changing the conductivity of electricity of a polycrystal silicon layer which forms the thin film transistor.

In an organic EL display using this method, there is a concern that the uniformity of emitted brightness is degraded due to the variability of the current supplied to the organic EL element because there is a variations in the characteristics of thin film transistor. In order to realize, for example, 256 gradations of brightness on a large area of a display by changing the current value in a thin film transistor, it is necessary to control the current value of the organic EL element within a precision of 0.5% by switching elements such as a thin film transistor. However, because the variability of the current value at the time of impressing of intermediate voltage is large in recent transistors in which the active layer is a low temperature polycrystal silicon thin film, it is therefore difficult to sufficiently control the brightness level at 256 levels.

In contrast, the variation of the characteristics of the transistors in which the active layer is a single crystal semiconductor is small; however, because such a transistor is usually manufactured in high temperature processes such as at 600° C. or higher, it is difficult to form such a transistor on the glass base board etc. which is currently usable as a large-area transparent base board. Also, translucent, single crystal semiconductor base board such as single crystal silicon base board cannot be used as a base board for organic EL display in which display transparency is required.

Also, in an active-matrix type organic EL display in FIG. 19, the aperture ratio is as small as 10% because the light from the organic EL element as a pixel 35 is blocked by four lines of wiring 31 to 33, and 38, two transistors 34 and 37, and capacity 36. Accordingly, in order to improve the aperture ratio of the active-matrix type organic EL display, it is necessary to decrease the area of the thin film transistor or the wiring.

Furthermore, regarding enlarging the display, the area of recent amorphous silicon transistor built-in active-matrix type liquid crystal display is 1 m×1 m at maximum. In an active-matrix type organic EL display, thin film transistors in which the active layer is a low temperature polycrystal silicon film is used; however, because the sizes of manufacturing devices such as vacuum devices is limited, a size such as 1 m×1 m is considered to be the maximum area as it is for the liquid crystal display.

On the other hand, in an organic EL display which is provided with a thin film transistor in which an active layer is a polycrystal silicon thin film, the thin film transistor and the organic EL element are manufactured in the following ways.

First of all, the thin film transistor is formed on a glass base board 11 by a process shown in FIG. 20A to FIG. 20D.

As a manufacturing process for this thin film transistor, first of all, a film of amorphous silicon is formed on glass base board 11 by a PECVD method using $SiH_4$ and a LPCVD method using $Si_2H_6$. Consequently, this amorphous silicon is recrystallized to form polycrystal silicon film 12 by a laser irradiating method by using an excimer laser or a solid phase growing method. FIG. 20A shows this state. Consequently, after patterning this polycrystal silicon film 12, gate insulation film 13 is formed, and gate electrode 14 is furthermore formed by film-forming and patterning. FIG. 20B shows this state.

Consequently, impurities such as phosphorus or boron are shot into the polycrystal silicon film 12 in a self-adjusting manner by using a gate electrode 14. By doing this, source drain area 15 is formed on both sides of gate electrode 14, and a CMOSFET is formed. Consequently, an insulating film 16 in the first layer is formed, and after making a contact hole on this insulating film, the source drain electrode 17 is formed by film-forming and patterning. FIG. 20C shows this state. Consequently, insulating film 18 in the second layer is formed, and after making contact hole on this insulating film, ITO electrode 19 (electrode for pixel) is formed by film-forming and patterning. FIG. 20D shows this state.

Consequently, as shown in FIG. 21A, adhesion layer 21 is formed on insulating layer 18 in the second layer, and an aperture part is formed in the pixel area on ITO electrode 19 (electrode for pixel). Consequently, layer 22 between the layers is formed on this adhesion layer 21, and an aperture part is formed on the aperture part of cohesion layer 21.

Consequently, by the plasma treatment using oxygen plasma or CF4 plasma etc., the wettability on the surface of aperture part on ITO electrode 19 (electrode for pixel) is improved. After that, positive hole injecting holes 23 which forms the organic EL element and light emitting layer 24 are formed in this aperture part. This layers are formed by a liquid phase process such as a spin coat method, a squeegee applying method, an ink jet method, or a spattering method, and a vacuum process such as a vacuum vaporization method. In Japanese Unexamined Patent Application, First Publication, No. Hei 10-12377, it is disclosed that the organic light emitting layer which is provided for emitting colors such as red, blue and green can be randomly patterned in each pixel by forming and disposing organic EL material by an ink jet method.

Consequently, as shown in FIG. 21B, after a metallic thin film is formed as cathode 25 on light emitting layer 24, and cathode 25 is sealed by a sealing agent 26. As a metal for cathode 25, metal to which a metal alkali metal or an alkaline-earth metal is added is used for the purpose of minimizing the work function. Additionally, cohesion layer 21 is arranged for the purpose of improving the cohesion between base body and layer 22 between layers, and for the purpose of obtaining the correct dimensions for the area of light emission. Also, one of the purpose for arranging layer 22 between the layers is to lower the parasitic capacity by keeping cathode 25 at a distance from gate electrode 14 and source drain electrode 17. Another purpose for arranging layer 22 between layers is to control the wettability on the surface at the time of forming positive hole injecting hole 23 and light emitting layer 24 in liquid phase process so as to achieve the correct patterning.

In this way, in the manufacturing method for a conventional organic EL display element, in order to form a transistor, the forming of a thin film over the entire display base board, and the removing of the waste part of the material which forms the thin film by patterning are repeated. In particular, the material which forms the thin film of the organic EL element part and the wiring part are removed to a great extent; therefore, there is an allowance of improvement from the viewpoint of efficient use of resources.

BRIEF SUMMARY OF THE INVENTION

The present invention is achieved by focusing on the above problem in the conventional technology, and the first object of the present invention is to obtain organic EL display wherein transistors with less variation of the characteristic (transistor in which active layer is a single crystal semiconductor) is formed on a large area of a transparent base board.

A second object of the present invention is to improve the aperture ratio of the active-matrix type organic EL display.

A third object of the present invention is to reduce the amount of the material to be removed which forms the thin film in the manufacturing process of the organic EL display.

A fourth object of present invention is to achieve a method wherein an organic EL display having an area of 1 m×1 m or larger is easily obtained.

In order to solve above objects, the present invention provides a manufacturing method for organic EL display characterized in having a process wherein an unit block which has a semiconductor element is disposed at a predetermined position on the display base board in the manufacturing process for an organic EL display having an organic EL element and a semiconductor element which drives this organic EL element on the base board of the display. This unit block is formed, for example, by dividing the base board such as single crystal semiconductor base board or other type of base board on which the plural semiconductor elements are formed in rows. Otherwise, a commercially available unit block can be purchased to be used.

In this method, a semiconductor element which drives an organic EL element is not directly formed on the display base board, and a unit block having this semiconductor element is disposed at a predetermined position on the base board of the display. Therefore, by using a unit block wherein a semiconductor element is formed on a single crystal semiconductor base body, a transistor in which the active layer is a single crystal semiconductor (a transistor with less variation of characteristics) can be disposed on a less heat-resistant glass base board etc. By doing this, organic EL display wherein a transistor with less variation of the characteristics is formed on a large area of a transparent base body can be obtained.

Also By doing this method, the throughput after the formation of the display is improved by inspecting the unit block which is prepared by disposing only flawless items on the display base board after eliminating defective items. By doing this, a highly reliable organic EL display can be efficiently obtained.

Also, the size of the element of the transistor in which the active layer is a single crystal semiconductor can be reduced as compared with the size of the transistor in which active layer is a low temperature polycrystal silicon thin film. By doing this, area occupied by the semiconductor element is decreased; therefore, the aperture ratio of the active-matrix type organic EL display can be improved. Also, because it is not necessary to use a large area of a base board in the manufacturing process for the unit block, the size of devices which are used in a thin film forming process or an etching process can be reduced.

Also, because a semiconductor is not formed on the display base board due to the fact that the semiconductor element is formed in the unit block, the thin film which was wastefully formed on the organic EL element and which was then removed from organic EL element for forming the semiconductor element is not formed at all. Therefore, the amount of the material removed which forms the thin film in the manufacturing process for an organic EL display can be reduced as compared to the conventional method.

In this way, the size of the manufacturing device can be reduced; therefore, the material in the manufacturing process can be conserved, and the manufacturing cost of the organic EL display can be reduced.

In the present invention, as a method for disposing a unit block at a predetermined position on the display base board, the following three methods can be selected. Also two or more of these methods can be used together.

In the first method, the concavity which accommodates to the shape of the unit block is formed at a predetermined position on the display base board, and by fitting the unit block into this concavity in the liquid, the unit block is disposed at a predetermined position on the display base board.

In the second method, a hole piercing through in the thickness direction is opened at a predetermined position on the display base board, and by increasing the pressure on one side on the display base board above the pressure on the other side, or by introducing a unit block at the position of the hole on the surface on one side of the display base board by guiding the liquid to the hole, the unit block is disposed at a predetermined position on the display base board.

In the third method, a unit block is introduced and is disposed at a predetermined position on the display base board by Coulomb attractive forces. In this case, by electrifying the predetermined position of the display base board and the unit block to have opposite electrical charges each other, or by electrifying one of the predetermined position of the display base board or the unit block, Coulomb forces are produced between the predetermined position of the display base board and the unit block.

In the method of the present invention, the material for the organic EL element should preferably be disposed by an ink jet method corresponding to the position of the pixel on the display base board. Also, the wiring which is formed on the display base board should preferably be formed by an ink jet method.

The ink jet method, as realized in the field of printing, easily disposes the liquid material at predetermined positions by increasing the movable range of the head part of the ink jet, even up to the scale of a display such as 1 m×1 m for example. In contrast, in the method wherein an organic EL element and wiring are formed by patterning by film forming and etching, the size of the display which can be manufactured is limited according to the size of the necessary manufacturing device such as a vacuum device.

The method for present invention is appropriately applied to a case in which the driving method is an active-matrix method, that is, the case of an active-matrix type EL display. In the case of an active-matrix type organic EL display, each of the organic EL elements which forms a pixel are connected by wiring such as scanning lines, signal lines, and power supply lines. In this case, it is preferable that the scanning lines, signal lines and power supply lines and connecting terminals with wiring inside the unit block of these wirings be formed in advance on the display base board in the unit block, and the unit block is disposed at predetermined positions on the display base board after the connecting terminal with the wiring on the display base board is formed in advance at the position contacting these terminals at the time of disposing on the display base board. By doing this, the wiring process after disposing a unit block on the display base board can be omitted.

A unit block should preferably have plural semiconductor elements in order to drive plural neighboring organic EL elements. By doing this, because the number of unit blocks which are disposed on one organic EL display can be decreased, the cost is reduced. Also, because the number of disposing points for unit blocks is decreased, erroneous disposing of unit blocks, or wiring errors at the time of connecting the terminal of the unit block side and the terminal of the display base board side by wiring, can be reduced.

Also, by arranging the relationship of the position of plural terminals of a unit block which has plural semiconductor elements in an axisymmetric or point-symmetric, wiring errors can be reduced. As the disposing method, the following methods may be chosen.

① The planar shape of the unit block is made polygonal, and plural terminals for each organic EL element are disposed so as to be rotationally symmetric centered around the center of this polygon.

② The planar shape of the unit block is made equilaterally polygonal, and plural terminals for each organic EL element are disposed so as to be rotationally symmetric centered around the center of this equilateral polygon.

③ By the method ②, the rotation angle at which the terminal position does not change even if the terminal rotates is a value such as 360° C./n (n is the number of sides of the polygon). That is, for example, in the case in which the planar shape of the unit block is a square, terminals are disposed at the same position when the rotation angle is 90° C. In the case in which the planar shape of unit block is a pentagon, terminals are disposed at the same position when the rotation angle is 72° C. In the case in which the planar shape of the unit block is a hexagon, terminals are disposed at the same position when the rotation angle is 60° C.

④ The planar shape of the unit block is made rectangular, and plural terminals for each organic EL element are disposed so as to be axisymmetric around both center lines which are parallel with the longer sides of this rectangle and the center line which is parallel with the shorter sides of this rectangle.

⑤ The planar shape of the unit block is made rectangular, and plural terminals for each organic EL element are disposed in such a way that the terminals are disposed at the same position at the time of rotation by 180° C. centered around the center of this rectangle.

⑥ The planar shape of the unit block is made polygonal, and plural terminals for each organic EL element are disposed along each diagonal line of this polygon, and positions of the terminals on each of the diagonal line are that the same terminal is at the same previous position after the rotation.

⑦ The planar shape of the unit block is made equilateral polygon, and plural terminals for each organic EL element are disposed along each diagonal line of this equilateral polygon, and the position of the terminals on each of the diagonal line are that the same terminal is at the same previous position after the rotation.

According to the methods ③ and ⑦, at the time of fitting unit block into concavity which is formed on the side of the base board corresponding to the planar shape of the unit block, the position of the terminal is the same on the base board even if a side of the equilateral polygon which forms the unit block is put to any side of the equilateral polygon which forms the concavity. That is, it is not necessary to determine the corresponding side of an equilateral polygon between a unit block and a concavity in advance, and the position of the terminals always coincide when the unit block fits into the concavity.

According to the methods ④ and ⑤, at the time of fitting a unit block into a concavity which is formed on the side of the base board corresponding to the planar shape of the unit block, the position of the terminal is the same on the base board even if the longer side and the shorter side of the rectangle which forms the unit block is put to any longer side and shorter side of rectangle which forms the concavity. That is, it is not necessary to determine the corresponding side of an equilateral polygon between a unit block and a concavity in advance, and the position of the terminals always coincides when a unit block fits into a concavity.

FIG. 22A to FIG. 22D show examples of the disposing terminals according to the method ① to ③ FIG. 22E, FIG. 22F show examples of the disposing terminals according to method ④ or method ⑤ respectively. In FIG. 22E, and FIG. 22F, single dot chain line L1 is a center line which is parallel with the longer side of the rectangle, single dot chain line L2 is a center line which is parallel with the shorter side of the rectangle. FIG. 22A also shows an example of the disposing the terminals according to method ⑥ or method ⑦. Additionally, in FIG. 22A to FIG. 22F, reference numeral 39 is a unit block and reference symbol T is terminal.

As a method of disposing a unit block, a method such as disposing plural groups of organic EL elements on the display base board in a manner such that neighboring red emission, blue emission, and green emission elements are one group, and disposing the unit block which has a semiconductor element for driving three organic EL elements to the position which is the center of three organic EL elements, in a manner a group-by-group, can be selected.

Also as a method of a disposing a unit block, a method such as disposing plural groups of organic EL elements on the display base board in such a manner that two red emission, two elements for blue emission, and two elements for green emission for a total six elements the neighboring organic EL, elements are in one group, and disposing a unit block which has a semiconductor element for driving six elements of organic EL element to a position which is between six elements of organic EL element, in a group-by group manner, can be selected.

According to the number "n" which is the number of the organic EL elements (pixels) which are driven by the semiconductor element of the unit block, the number of the unit blocks which is disposed at one organic EL display can be decreased to 1/n. Also, as the number n increases, the cost reducing effect, effect of reduced errors in disposing the unit block, and effect of decreasing wiring errors are increased.

The present invention also provides a method of disposing a semiconductor element characterized in that, in the method of disposing a semiconductor element which disposes a unit block which has a semiconductor element in a predetermined position on the base board, hole which pierces through in the thickness direction is opened in a predetermined position on the base board, unit block is introduced to the position of the hole on one side of this base board by increasing the pressure on one side of the display base board than the pressure on the other side, or by guiding the liquid to the hole.

The present invention also provides a method of disposing a semiconductor element characterized in that, in the method of disposing a semiconductor element which disposes unit block which has semiconductor element in predetermined position on the base board, unit block is drawn to a predetermined position on the base board by Coulomb attractive forces. In this case, by electrifying the predetermined position of the display base board and unit block to have opposite electrical charges, or by electrifying either one of the predetermined position of the display base board or unit block, Coulomb forces are produced between the predetermined position of the display base board and the unit block.

The present invention also provides a manufacturing method for a semiconductor device characterized in that, in a manufacturing method for a semiconductor device which has a process which disposes a unit block which has a semiconductor element at a predetermined position on the base board, wiring which is formed on the base board is formed by an ink jet method.

The present invention also provides a manufacturing method for a semiconductor device characterized in that, in a manufacturing method for a semiconductor device which has a process which disposes a unit block which has semiconductor element at a predetermined position on the base board, wiring and connecting terminals with wiring inside the unit block of this wiring are formed on the base board in advance, the unit block is disposed at a predetermined position on the base board after the connecting terminal with the wiring on the base board is formed in advance at the position where the connecting terminal contacts the terminal on the base board at the time of disposing the unit block on the base board.

The present invention also provides a manufacturing method for a semiconductor device characterized in that, in a manufacturing method for a semiconductor device which has a process which disposes a unit block which has a semiconductor element at a predetermined position on the base board, the manufacturing method for a semiconductor device is provided wherein the planar shape of unit block is made polygonal, and plural terminals for each semiconductor elements are disposed so as to be rotationally symmetric centered at the center of this polygon. In this method, the polygon should preferably be an equilateral polygon.

The present invention also provides a manufacturing method for a semiconductor device characterized in that, in a manufacturing method for a semiconductor device which has a process which disposes a unit block which has semiconductor element at a predetermined position on the base board, the manufacturing method for the semiconductor device is provided wherein a planar shape of the unit block is made rectangular, and plural terminals for each semiconductor element are disposed so as to be axisymmetric to both center lines which are parallel to the longer side of this rectangle and center line which is parallel to the shorter side of this rectangle.

The present invention also provides a manufacturing method for a semiconductor device characterized in that, in a manufacturing method for a semiconductor device which has a process which disposes a unit block which has a semiconductor element at a predetermined position on the base board, the manufacturing method of the semiconductor device is provided wherein a planar shape of a unit block is made polygonal, and plural terminals for each semiconductor element are disposed along each diagonal line of this polygon, and the position of the terminals on each of the diagonal lines are in such a way that the same terminal is at the same previous position after the rotation. In this method, the polygon should preferably be an equilateral polygon.

As a "semiconductor device" in the manufacturing method for these semiconductor devices, a memory cell and a liquid crystal display can be mentioned for example. Also, the method of disposing terminals ① to ⑦ which is explained as a manufacturing method for an organic EL display can also be applied as a method of disposing a terminal of a semiconductor element in this manufacturing method for a semiconductor device.

The present invention also provides a manufacturing method for an active-matrix type organic EL display characterized in that, in a manufacturing method for an active-matrix type organic EL display wherein a light emitting layer which is inserted among at least two electrodes per pixel and the light emitting layer is driven by a semiconductor element, is formed, a semiconductor element is formed on the base board, the semiconductor element is detached from the base board so as to be divided per unit block, the unit block of the semiconductor element is disposed on other base board.

The manufacturing method for an electro-optic device of the present invention is characterized in having process wherein a unit block having the semiconductor element is disposed at a predetermined position of the display base board in the manufacturing method for an electro-optic device which is provided with an electro-optic element and a semiconductor element which drives this electro-optic element on the display base board.

Also, an electro-optic device of the present invention is characterized in that the unit block which is provided with the driving circuit which has the semiconductor element is disposed at a predetermined position on the display base board, in the electro-optic device which is provided with an electro-optic element and a semiconductor element which drives this electro-optic element on the display base board. In addition, "a driving circuit" which is mentioned here includes, for example, a peripheral driving circuit which is disposed around the display region so as to produce a picture signal and scanning signal etc. for each pixel in the display region, or a transistor which drives each pixel, and wiring and terminals which are connected to the transistor.

Furthermore, plural terminals for each electro-optic element should preferably be disposed in the unit block so as to be rotationally symmetric centered around the center of the unit block in plan view.

According to the present invention, a semiconductor which drives an electro-optic element is not directly formed on the display base board, and unit block which has this semiconductor element is disposed at a predetermined position on the display base board. Therefore, by using a unit block wherein a semiconductor element is formed in single crystal semiconductor base board, transistor in which the active layer is a single crystal semiconductor (transistor with less variation of the characteristics) can be disposed on a less heat-resistant glass base board etc. By doing this, electro-optic device is obtained wherein a transistor with less variation of the characteristics is formed on a large area of transparent base board.

Also, the throughput after the formation of the display is improved by inspecting the unit block which is prepared, by disposing only perfect items on a display base board after eliminating defective items. By doing this, highly reliable electro-optic devices can be efficiently obtained.

Also, the size of the element of the transistor in which the active layer is a single crystal semiconductor can be reduced as compared with the size of the transistor in which the active layer is a low temperature polycrystal silicon thin film. Also, because it is not necessary to use a large area of base board in the manufacturing process of a unit block, the size of devices which are used in the thin film forming process or the etching process can be reduced.

Also, because the semiconductor element is not formed on the display base board due to the fact that a semiconductor element is formed in a unit block, and a thin film which would have been wastefully formed and removed to form the semiconductor element as in the conventional method is not formed at all. Therefore, the amount of the material removed for a forming thin film can be reduced in the manufacturing process for electro-optic device as compared with a conventional method. In this way, because the size of the manufacturing device can be diminished, and the materials for the manufacturing process can be conserved, the manufacturing cost of electro-optic device can be reduced.

An electronic device of the present invention is characterized in being provided with an electro-optic device of the present invention.

Effects of Invention

According to the manufacturing method for organic EL displays of the present invention, an organic EL display wherein transistors with less variation in characteristics (transistor in which the active layer is a single crystal semiconductor) is formed on a large area of the transparent base body can be obtained.

Also, according to the manufacturing method for an organic EL display of the present invention, an active-matrix type organic EL display with a high aperture ratio can be obtained.

Also, according to the manufacturing method for an organic EL display of the present invention, because the amount of the material for forming thin film which is removed in the manufacturing process for an organic EL display can be reduced, efficient use of resources and reduction in manufacturing cost can be attempted.

Also, according to the manufacturing method for an organic EL display of the present invention, by adapting the ink jet method etc., an organic EL display which is 1 m×1 m or larger will soon be easily obtainable.

Also, according to the disposing method for a semiconductor element of the present invention, the disposition of a unit block against the base board can be performed more reliably and more easily than the disposing method for the unit block in the concavity of the base board.

Also, according to the disposing method for a semiconductor element of the present invention, a semiconductor device having a process wherein a unit block having a semiconductor element is disposed at a predetermined position of the base board can be easily obtained.

BRIEF DESCRIPTION OF THE SEVERAL VIEWS OF THE DRAWINGS

FIG. 12 is a drawing which explains a disposing method for a unit block.

FIG. 23 is a perspective view which shows the construction of a personal computer as one example of an electronic device of the present invention.

FIG. 24 is a perspective view which shows the construction of a mobile phone as one example of the electronic device.

DETAILED DESCRIPTION OF THE INVENTION

Embodiments of the present invention are explained below.

Figure 1:
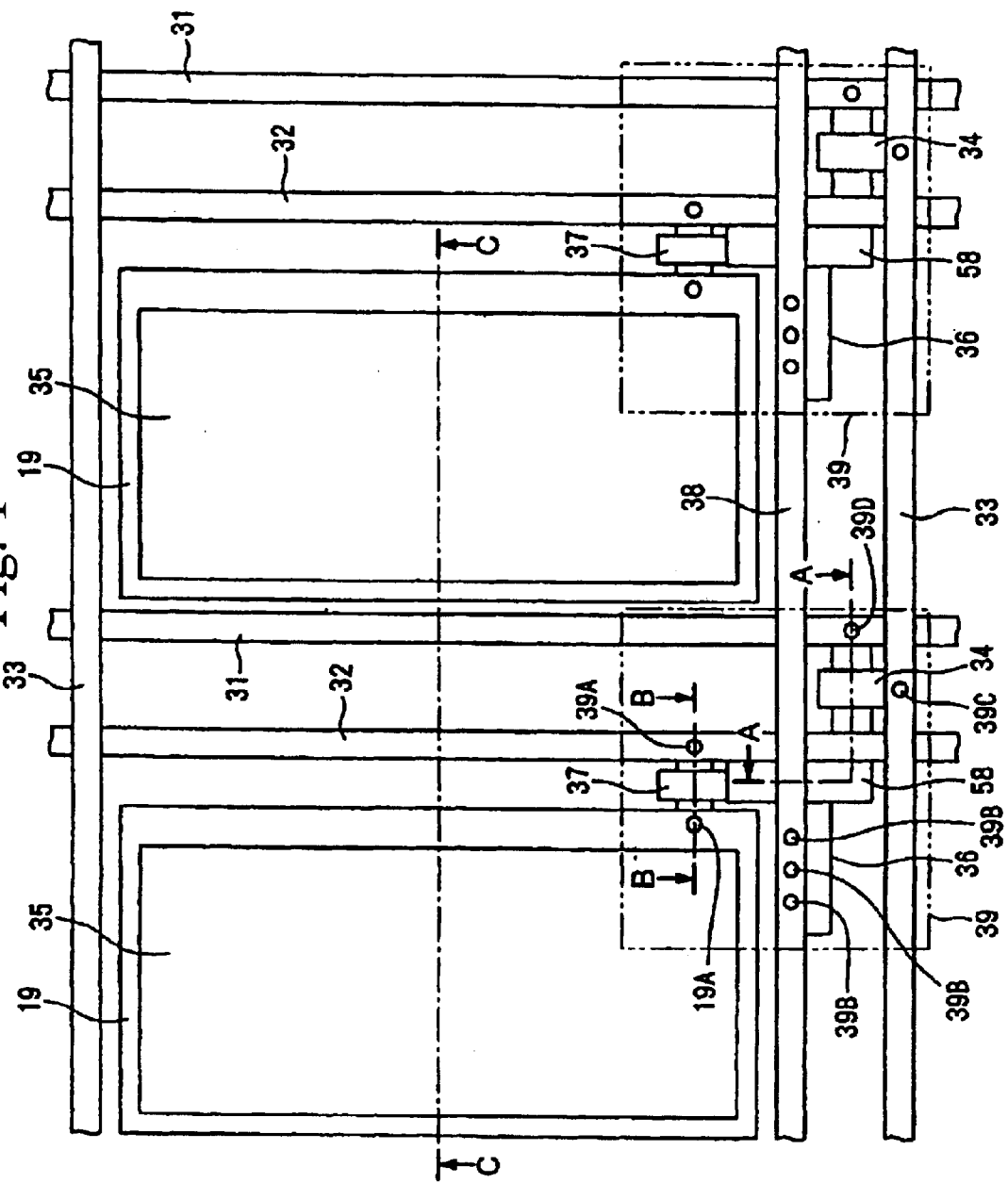
FIG. 1 is a plan view showing one part of an active-matrix type organic EL display which is manufactured by the manufacturing method for an organic EL display according to an embodiment of the present invention.
Figure 2:
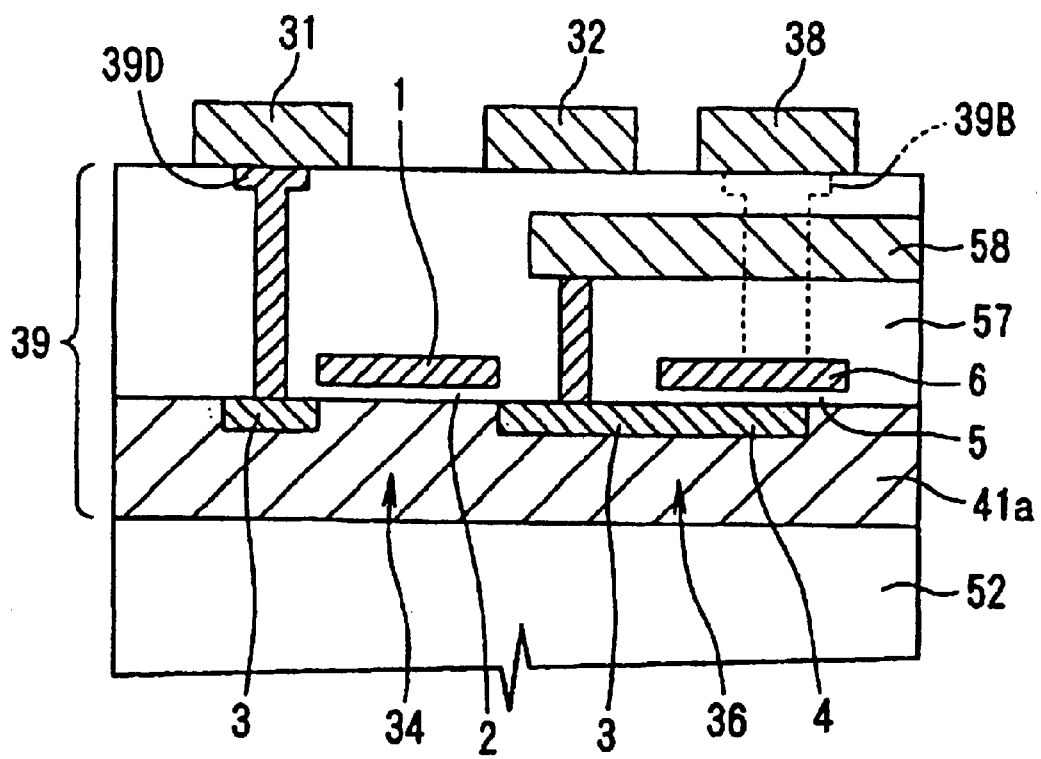
FIG. 2 is a cross section along line A—A in FIG. 1.
Figure 3:
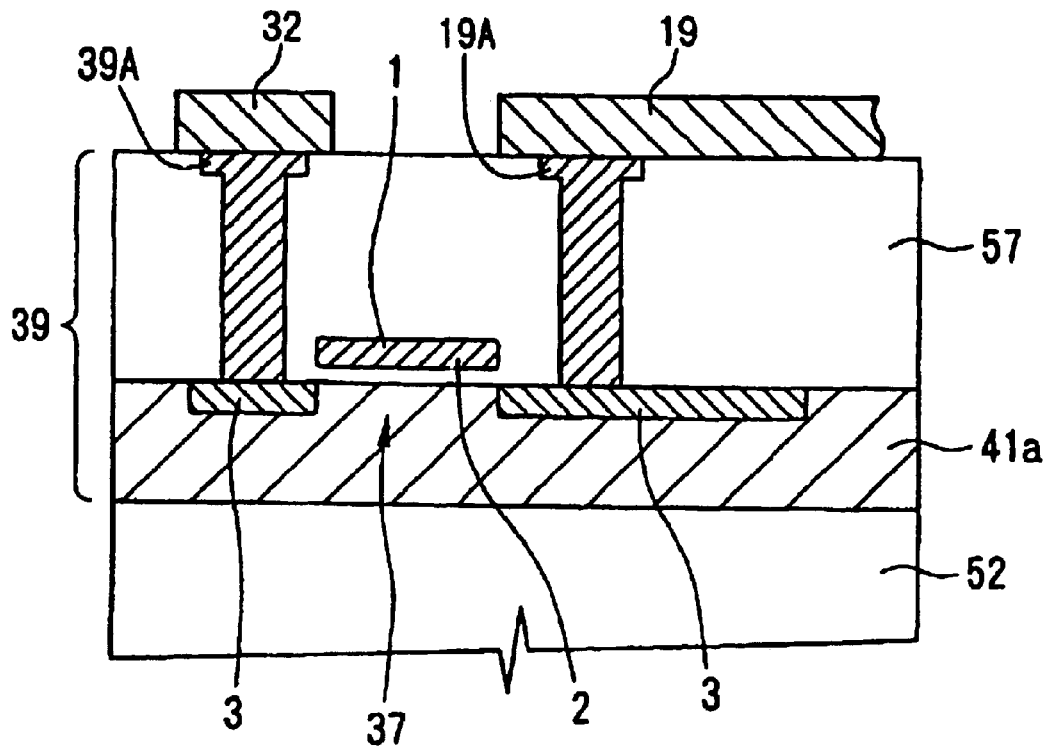
FIG. 3 is a cross section along line B—B in FIG. 1.
Figure 4:
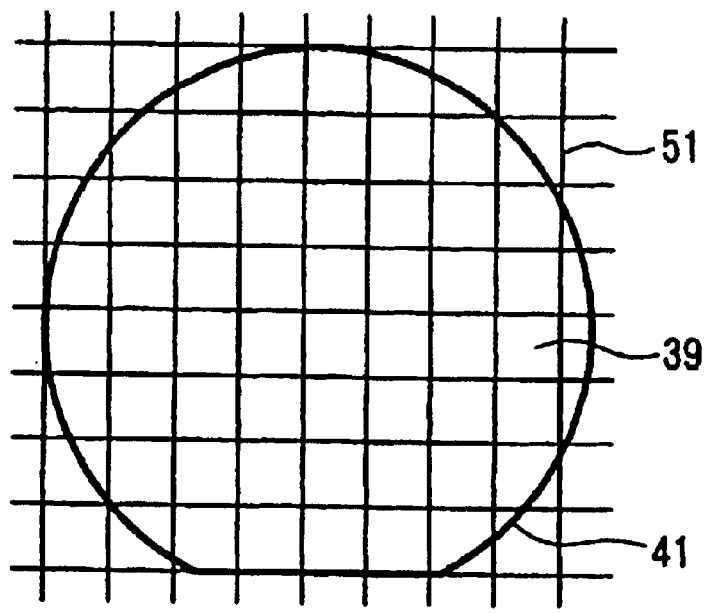
FIG. 4 is a drawing which explains the manufacturing method for an organic EL display according to an embodiment of the present invention, and is a drawing which explains a manufacturing method for a unit block.
Figure 5:
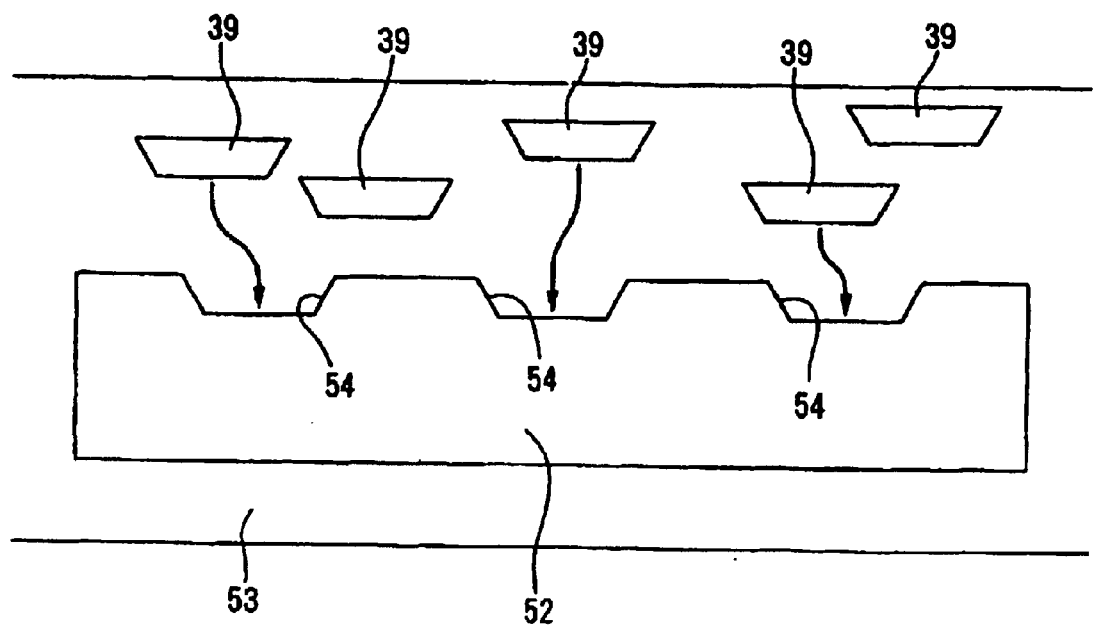
FIG. 5 is a drawing which explains a manufacturing method for an organic EL display according to an embodiment of the present invention, and is a drawing which explains a disposing method for a unit block.
Figure 6:
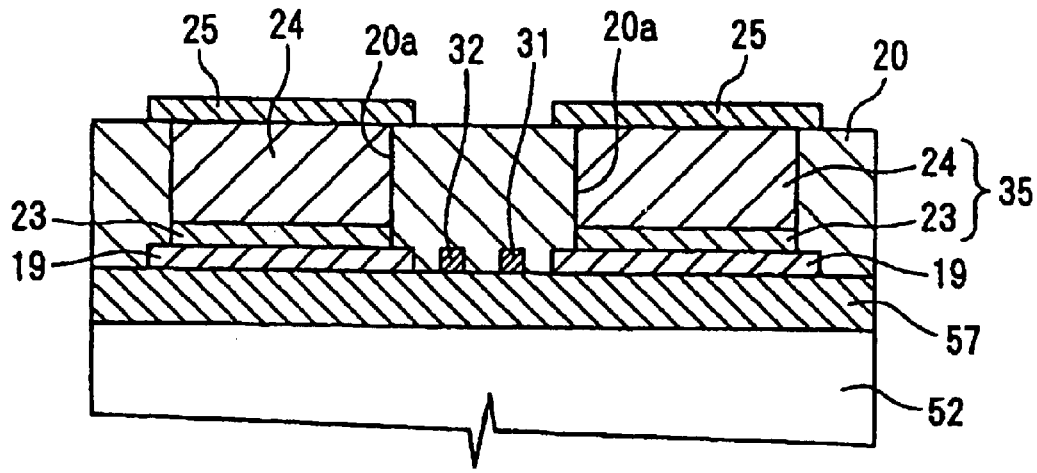
FIG. 6 is a cross section along line C—C in FIG. 1.

A manufacturing method for an organic EL display according to an embodiment of the present invention is explained with reference to FIG. 1 to FIG. 6. FIG. 1 is a plan view showing one part of an active-matrix type organic EL display which is manufactured by the manufacturing method for this embodiment. FIG. 2 is a cross section along line A—A in FIG. 1, and FIG. 3 is a cross section along line B—B in FIG. 1. FIG. 4 is a drawing which explains a manufacturing method for an organic EL display according to an embodiment of the present invention, and is a drawing which explains a manufacturing method of a unit block. FIG. 5 is a drawing which explains a method of disposing a unit block. FIG. 6 is a cross section along line C—C in FIG. 1.

In this display, pixel 35 which is made of an organic EL element and pixel electrode 19 are disposed at each pixel position, and switching transistor 34, driving transistor 37, capacity 36 are provided as semiconductor elements for driving each pixel 35. Also, these elements are connected to a driving circuit which is disposed in a peripheral part of the display, by signal line 31, power supply line 32, scanning line 33, and capacity line 38.

This display is manufactured after going through the process which disposes unit block 39 in a predetermined position on glass base board (display base board) 52 as shown as follows. Also this display has one unit block 39 per each pixel 35.

In this unit block 39, switching transistor 34, driving transistor 37, and capacity 36 are formed as semiconductors as shown in FIG. 2 and FIG. 3. Both transistors 34 and 37 are MOSFETs which have gate electrode 1, and gate oxide film 2, and source drain domain 3. Source drain domain 3 is made of an impurity diffusion layer of a single crystal silicon base board 41a. Capacity 36 is comprised of conducting layer 4 which is made of an impurity diffusion layer of single crystal silicon base board 41a, insulating layer 5 which is formed on conducting layer 4, and electrode 6 which is formed on insulating layer 5.

Also, in this unit block 39, wiring 58 which connects both transistors 34 and 37 is formed. Furthermore, in this unit block 39, terminal 39C for connecting with scanning line 33, terminal 39D for connecting with signal line 31, terminal 39A for connecting with power supply line 32, and terminal 39B for connecting with capacity line 38 are formed. Reference numeral 57 is an insulating film. First, as shown in FIG. 4, the fine structure of this unit block 39 is formed on a silicon wafer (a single crystal semiconductor base board) 41 on plural pieces in rows. Next, by dicing this silicon wafer 41 at dicing lines 51, many pieces of unit block 39 are obtained. Next, many pieces of the obtained unit block 39 are inspected, and defective pieces are discarded.

On the other hand, as shown in FIG. 5, on a glass base board (display base board) 52, concavities (concave part) 54 are arranged at positions where unit blocks 39 are disposed by a process such as etching. Edge faces of the unit blocks 39 which are obtained by the abovementioned method are cut at an inclined angle along the plane of cleavage of a single crystal of silicon. Therefore, the surface of the inner wall of concavity 54 of glass base board 52 is shaped so as to correspond to a slanting surface of this unit block 39. Also, by cutting unit block 39 in such a way that the upper surface of the wafer (the surface on which semiconductors are formed) is larger than the opposite side of surface, and by arranging the shape of concavity 54 so that it spreads to upper surface corresponding to the abovementioned difference in the surface area, unit block 39 becomes to be able to fit in cavity 54.

By putting this glass base board 52 and unit block 39 in liquid 53, and by causing unit block 39 to move and flow along the surface of glass base board 52 (the surface on which the concavities 54 are formed), unit blocks 39 are fitted into concavities 54. By doing this, unit blocks 39 are disposed at predetermined positions on the glass base board 52.

Next, by doing the forming and the patterning of conducting film over the entire surface of a glass base board 52 which includes those unit blocks 39, the signal line 31, power supply line 32, scanning line 33, and capacity line 38 are formed. Next, the forming of ITO electrode 19 (pixel electrode) is performed.

Additionally, it is desirable that peripheral circuits of the display such as the shift resistor and driver, function element, etc., such as memory and operational logic device are formed.

Next, after forming insulating film 20 on the entire upper surface of glass base board 52 in a state in which these wiring 31 to 33 and 38 are provided, pixel electrode 19 are formed as shown in FIG. 6, and hole 20a of pixel area is arranged on electrode 19 by performing patterning. Positive hole injection layer 23 and light emitting layer 24 are formed in this hole 20a. This positive hole injection layer 23 and light emitting layer 24 form the pixel 35 (organic EL element).

Positive hole injection layer 23 is formed by, for example, applying polytetrahydrothiophenylphenylene as a precursor of polyphenylvinylene, and then heating this applied polytetrahydrothiophenylphenylene so as to form polyphenylvinylene. As a material for light emitting layer 24, cyanopolyphenylenevinylene as a red color light emitting material, polyphenylenevinylene as a blue color emitting material, polyalkylphenylene as a green color light emitting material can be mentioned.

Next, after cathode 25 which is comprised of Al including Li, is formed on light emitting layer 24 by performing film forming and patterning, the entire upper surface of the glass base board 52 is sealed by a sealing agent. Cathode 25 is omitted in FIG. 1.

Because an active-matrix type organic EL display which is obtained in this way is provided with transistor in which an active layer is a single crystal silicon with less variations of characteristics, the variability of the value of the current at the time of the impressing an intermediate voltage becomes small as compared with a conventional display which is provided with a transistor in which an active layer is a low temperature polycrystal silicon thin film, and it becomes possible to sufficiently control the brightness level at 256 gradations.

Also, the numerical aperture of this active-matrix type organic EL display is large because the occupying area occupied by the semiconductor element is small compared with a conventional display which is provided with a transistor in which the active layer is a low temperature polycrystal silicon thin film.

Also, in this method for this embodiment, a thin film of an organic EL element, etc., which was wastefully formed and removed in order to form the semiconductor element in the conventional method is not formed at all. Because of this, as compared with the conventional method, the amount of the material for forming thin film removed in the manufacturing process for the organic EL display becomes small.

In addition, it is desirable that a positive hole injection layer 23 and light emitting layer 24 may be formed by any method in the liquid phase process such a spin coat method, a squeegee applying method, an ink jet method etc., or a vacuum process such as a spattering method and a vacuum evaporation method; however, forming in the ink jet method is preferable.

Figure 7:
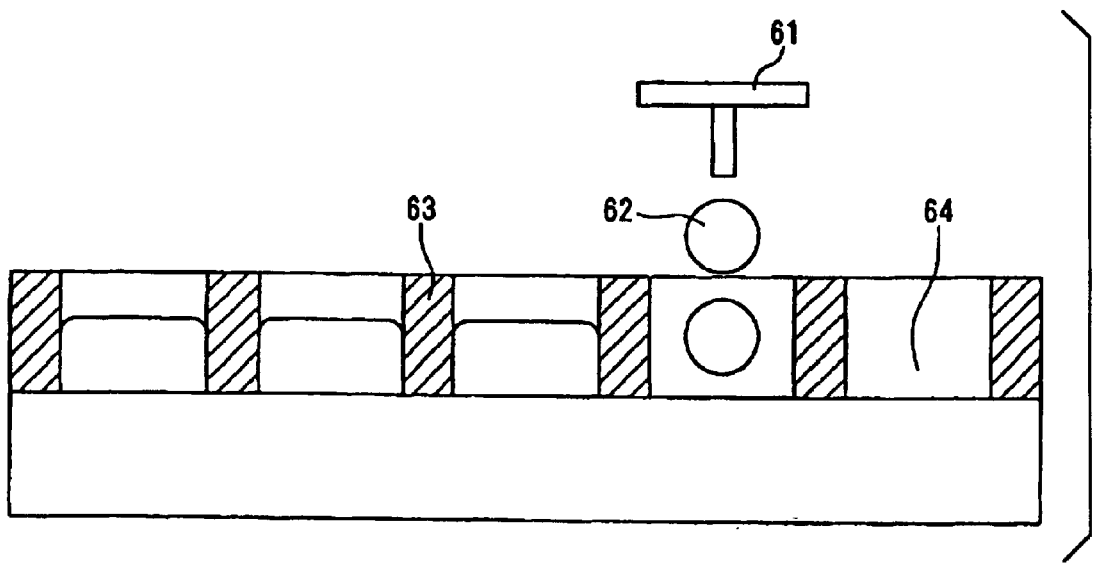
FIG. 7 is a drawing for explaining an ink jet method.

As shown in FIG. 7, in an ink jet method, by ejecting ink 62 from head part 61 while moving head part 61 of ink jet towards ink replenishing area 64, device move after dividing ink replenishing area 64 by slot body 63, ink 62 is replenished in ink replenishing area 64.

When replenishing hydrophilic ink (material, etc., of light emitting layer 24) in ink replenishing area 64, it is possible to easily replenish ink 62 inside of the ink replenishing area 64 by making the upper part of the slot body 63 water-repellent, without making the positioning accuracy against ink replenishing area 64 of head part 61 so high. As a material for slot body 63, polyimide is used, for example. Against slot body 63 made of this polyimide, by performing a plasma treatment using oxygen or fluorocarbon gas, the surface of slot body 63 can be made water-repellent.

Also, it is possible to form the wiring of signal line 31, power supply line 32, scanning line 33 etc. by an ink jet method. In this case, as an ink 62, material which is the liquid stuff including conductive material, and which can become a solid inside the ink replenishing area 64 by evaporation of solvent or by heat hardening, is used. As such a conductive material, an organometallic compound, metal complex, conductive organic polymer, precursor of a conductive organic polymer, liquid metal, fine-metal powder can be mentioned.

In this way, by forming the wiring of positive hole 23 and light emitting layer 24 which form organic EL element, signal line 31, power supply line 32, scanning line 33, etc. by an ink jet method, it becomes possible to easily obtain a large active-matrix type organic EL display of 1 m×1 m or larger.

Also, by the method which is explained next, the wiring process after unit block 39 is disposed on the display base board 52 can be omitted.

Figure 8:
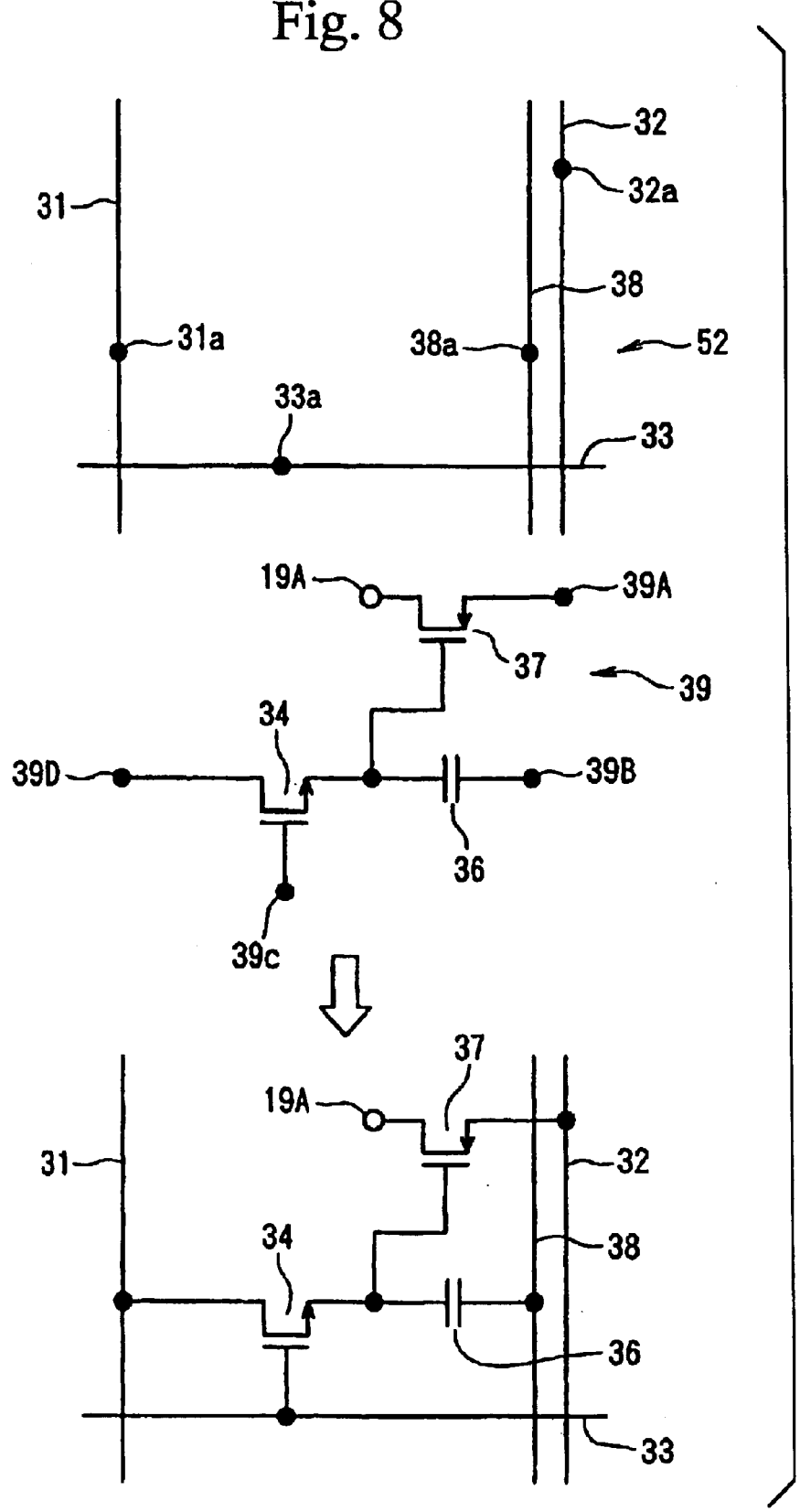
FIG. 8 is a drawing which explains the manufacturing method for an organic EL display according to an embodiment of the present invention, and is a drawing which explains the method, by which method the wiring process after disposing a unit block on the display base board is omitted.

In this method, as shown in FIG. 8, scanning line 33, signal line 31, power supply line 32, and capacity line 38, terminals 33a, 31a, 32a, and 38a for connecting with the wiring inside unit block 39 of these wiring are formed on the display base board 52 in advance. In unit block 39, in each position which contacts these terminals 33a, 31a, 32a, and 38a at the time of disposing on a display base board 52, terminals 39A to 39D for connecting with each wiring on the display base board 52 are formed in advance. In addition, reference numeral 19A is a terminal for a pixel electrode 19.

In this way, if unit blocks 39 are disposed at a predetermined position on display base board 52 by using these unit blocks 39 and display base board 52, terminals 33a, 31a, 32a, and 38a on display base board 52 and terminals 39A to 39D of the unit block 39 contact respective corresponding terminals. In this way, only by disposing unit block 39 at a predetermined position of display base board 52, the connection between a semiconductor element of unit block 39 and display base board 52 is completed.

With reference to FIG. 9 to FIG. 12, an embodiment other than that shown in FIG. 5, as a method which disposes a unit block at a determined position of the display base board, is explained.

Figure 9:
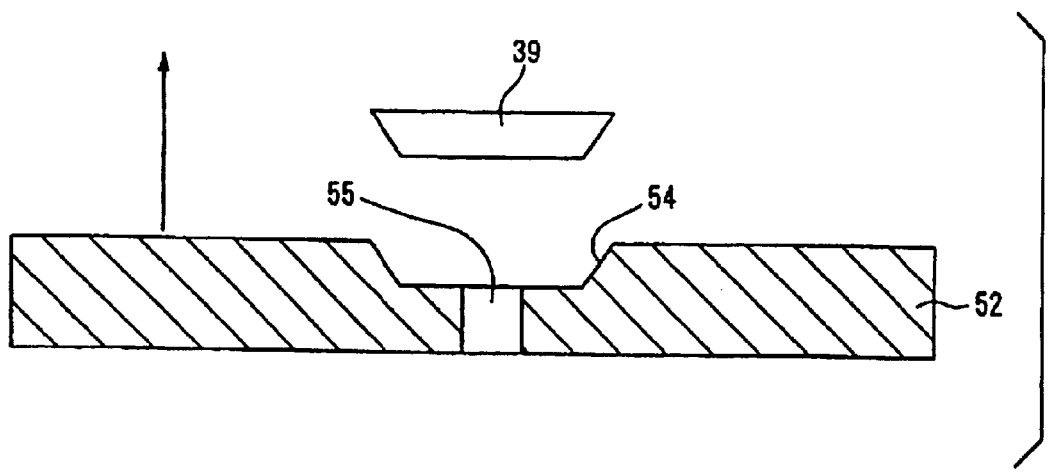
FIG. 9 is a drawing which explains the manufacturing method for organic EL display according to an embodiment of present invention, and is a drawing which explains a disposing method for a unit block.

In the method shown in FIG. 9, on display base board 52, as similar to the method for FIG. 5, concavities 54 with a shape corresponding to unit block 39 in the position where unit block 39 is disposed is arranged. In addition to this, in the center part of this concavity 54, hole 55 which penetrates through base board 51 in the thickness direction is arranged.

By putting this display base board 52 and the unit block 39 in a liquid or in an atmosphere of predetermined gas, and then by making unit block 39 fall to the side of the surface of display base board 52 (surface in which cavity 54 is formed), and at the same time, by lifting display base board 52 to the side of unit block 39, unit block 39 is fitted in concavity 54. In this say, unit block 39 is disposed at a predetermined position of glass base board 52.

Figure 10:
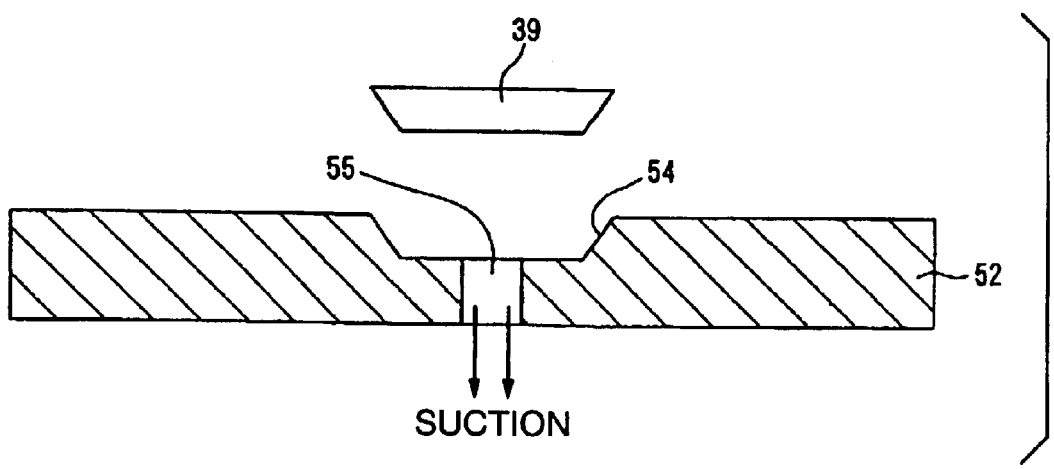
FIG. 10 is a drawing which explains the manufacturing method for organic EL display according to an embodiment of present invention, and is a drawing which explains a disposing method for a unit block.

In the method shown in FIG. 10, similarly to the method for FIG. 5, in display base board 52, concavity 54 in a shape corresponding to the shape of unit block 39 is arranged at the position where unit block 39 is disposed at addition to this, hole 55 which penetrates through the base board 51 for the display in the thickness direction is arranged in the center part of this concavity 54.

By placing this display base board 52 and unit block 39 in liquid or in a predetermined gas atmosphere, then by using hole 55 to suck the liquid or gas from the opposite side of the surface where concavity 54 is formed by a vacuum pump, the pressure on the side of the surface where the cavity is formed is made higher than the pressure on opposite surface. In this way, each unit block 39 is drawn into position in holes 55, and each unit block 39 is disposed in a predetermined position of glass base board 52.

Also, because a hole 55 exists in each position where a unit block 39 of display base board 52 is disposed, the display which is formed by the method for FIG. 9 and the method for FIG. 10 can cause the wiring from a semiconductor element of unit block 39 to face from this hole 55 to the back surface. In this way, the area of wiring which exists on the surface (surface where a pixel is formed) side on an organic EL display can be made small, and the amount of emitted light blocked by the wiring of the organic EL element can be reduced. Also, the light emitting area of organic EL element can be increased.

Figure 11:
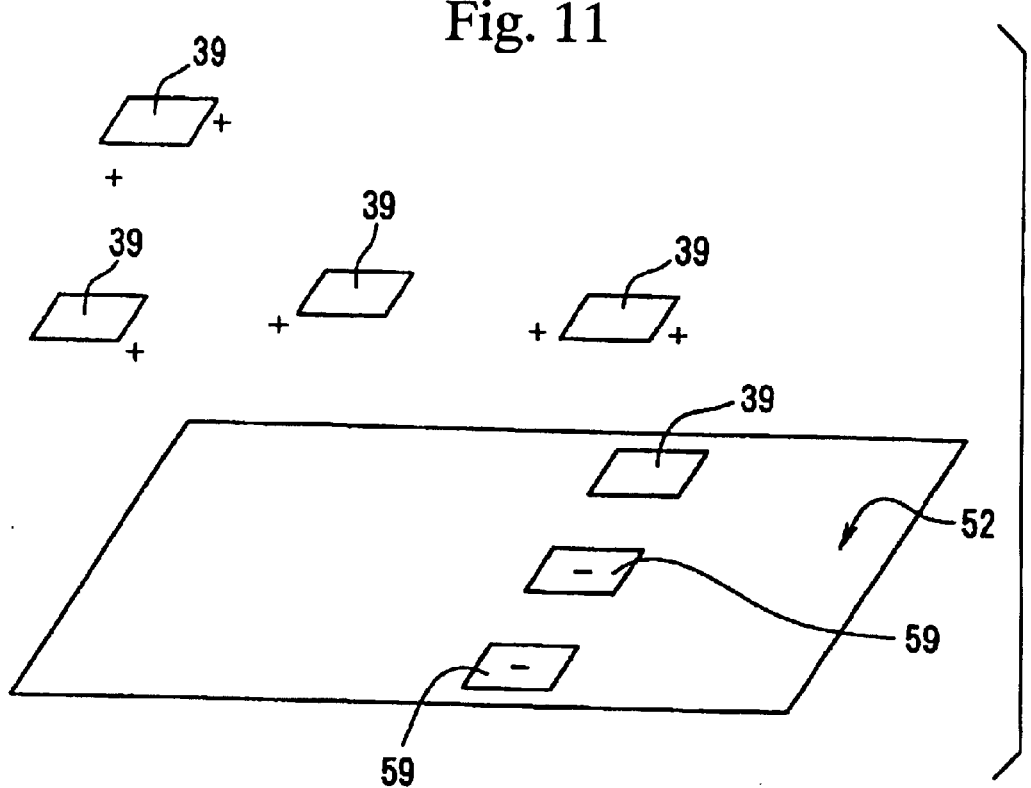
FIG. 11 is a drawing which explains the manufacturing method for organic EL display according to an embodiment of present invention, and is a drawing which explains a disposing method for a unit block.

In the method shown in FIG. 11, electrode 59 is formed in each position where a unit block of display base board 52 is disposed, unit block 39 which is electrically impressed in positive is disposed at upper direction of this display base board 52. By impressing each electrode 59 of display base board 52 in electrically negative, unit block 39 is introduced to the position of each electrode 59 by a Coulomb attractive force. In this way, each unit block 39 is disposed at a predetermined position on a glass base board 52.

Electrification of unit block 39 is performed by using a static electricity generating device etc. (a device which generates static electricity by rubbing a metal part with a belt etc.). Because the thickness of unit block 39 is usually between several $\mu$m to several hundreds of $\mu$m, the unit block can be moved by the force of static electricity. The atmosphere where this manipulation is done can be a vacuum, and also the atmosphere can be an insulating liquid or gas. In this method, because unit block 39 is not contacted to each electrode 59 unless the Coulomb attractive force between unit block 39 and each electrode 59 is larger than gravity which makes unit block 39 free-fall, the density of the atmosphere needs to be set bigger than a predetermined value.

Figure 12:
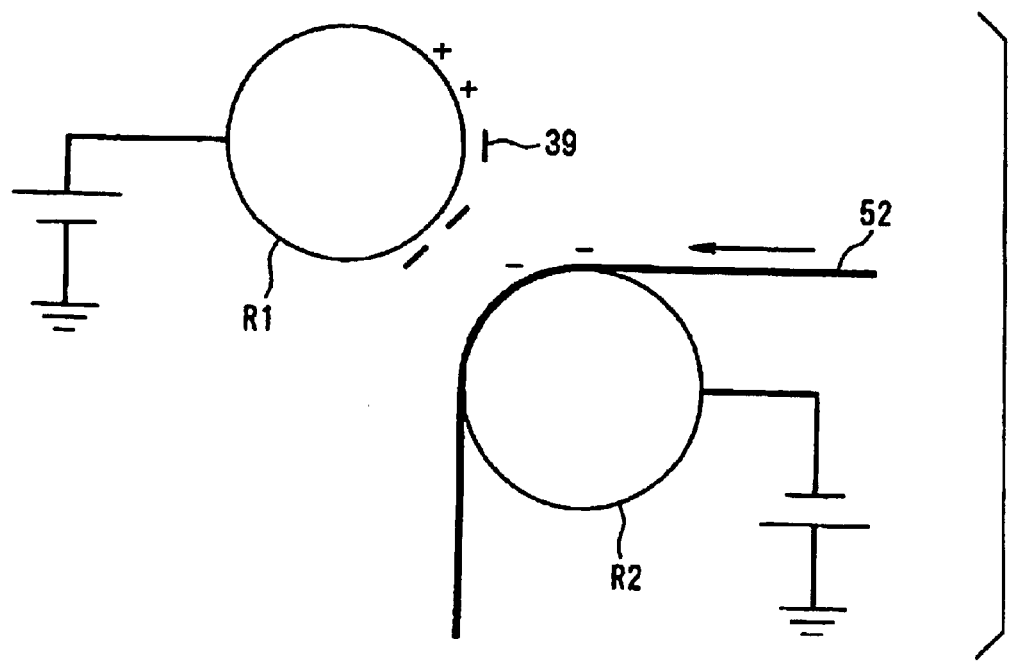
FIG. 12 is a drawing which explains the manufacturing method for organic EL display according to an embodiment of the present invention.

In the method shown in FIG. 12, unit block 39 is introduced and disposed in each position of display base board 52 by a Coulomb attractive force by utilizing the principle of a laser printer. That is, roller R1 for unit block 39 and roller R2 for display base board 52 are disposed at such a way that roller R1 for unit block 39 and roller R2 for display base board 52 face each other at a predetermined interval. In roller R2 of display base board 52, an electrode is formed in each position which corresponds to each position where unit block 39 of display base board 52 is disposed.

Roller R1 is electrified to be positive, and unit block 39 is made move along this roller R1. Each electrode which is arranged on roller R2 is electrified to be negative, display base board 52 is made to move along this roller R2. In this way, in the position where both roller R1 and R2 are closest, a unit block 39 which is electrified to be positive jumps to the position of each electrode which is electrified to be negative of display base board 52.

As a disposing method for a unit block in predetermined position of a display base board, other than these methods, such as a method according to the method of FIG. 10, but wherein concavity 54 is not formed, or such as combined method for FIG. 9 with the method for FIG. 11, or the method for FIG. 12, or such as combined method for FIG. 5 with the method for FIG. 11, or the method for FIG. 12, or such as combined method for FIG. 10 with the method for FIG. 11, or the method for FIG. 12, or such as combined method according to the method of FIG. 10, but wherein concavity 54 is not formed, with the method for FIG. 11, or the method for FIG. 12 can be mentioned.

Figure 13:
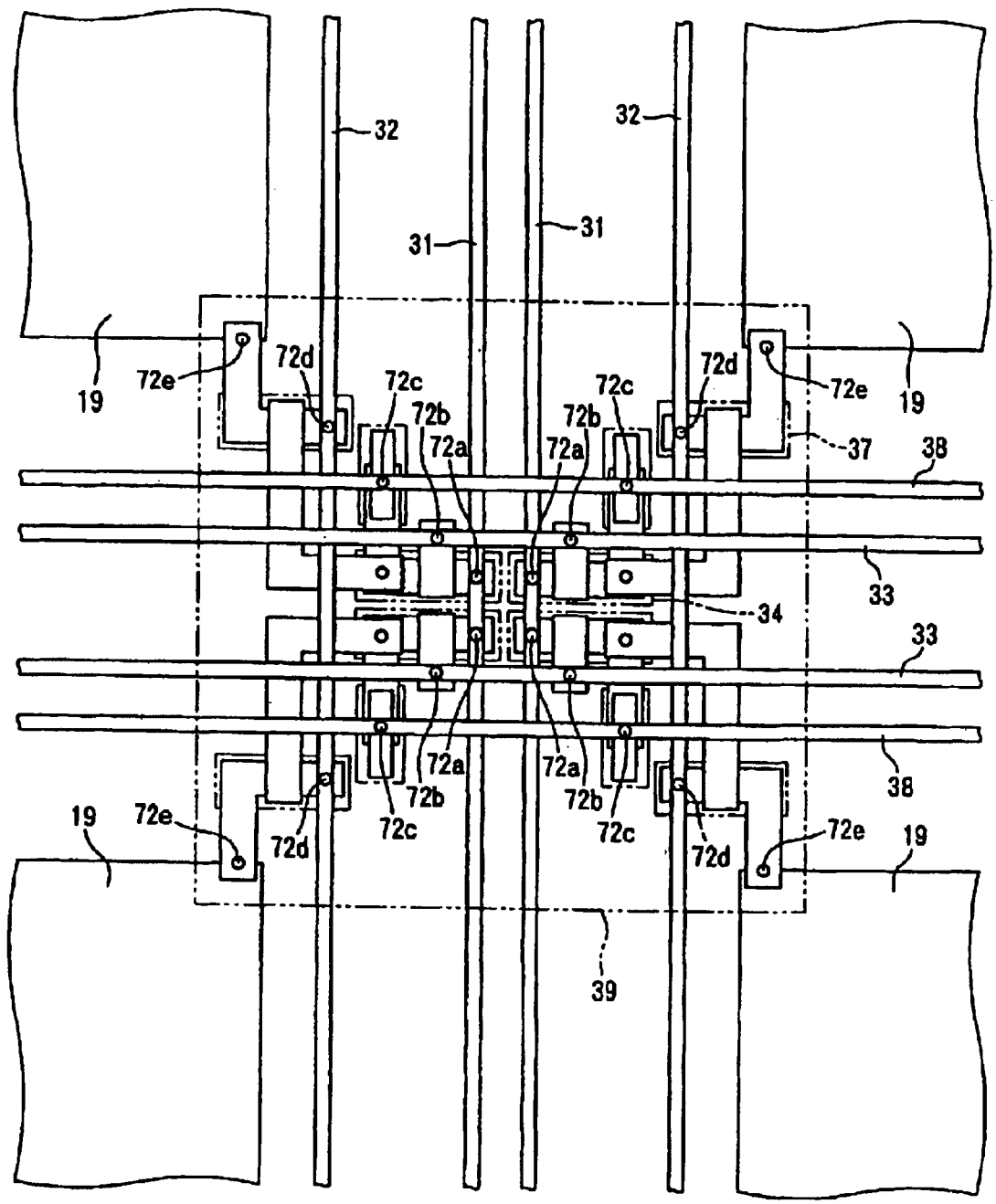
FIG. 13 is a plan view showing one part of an active-matrix type organic EL display wherein one unit block is disposed per 4 pieces of pixels.
Figure 14:
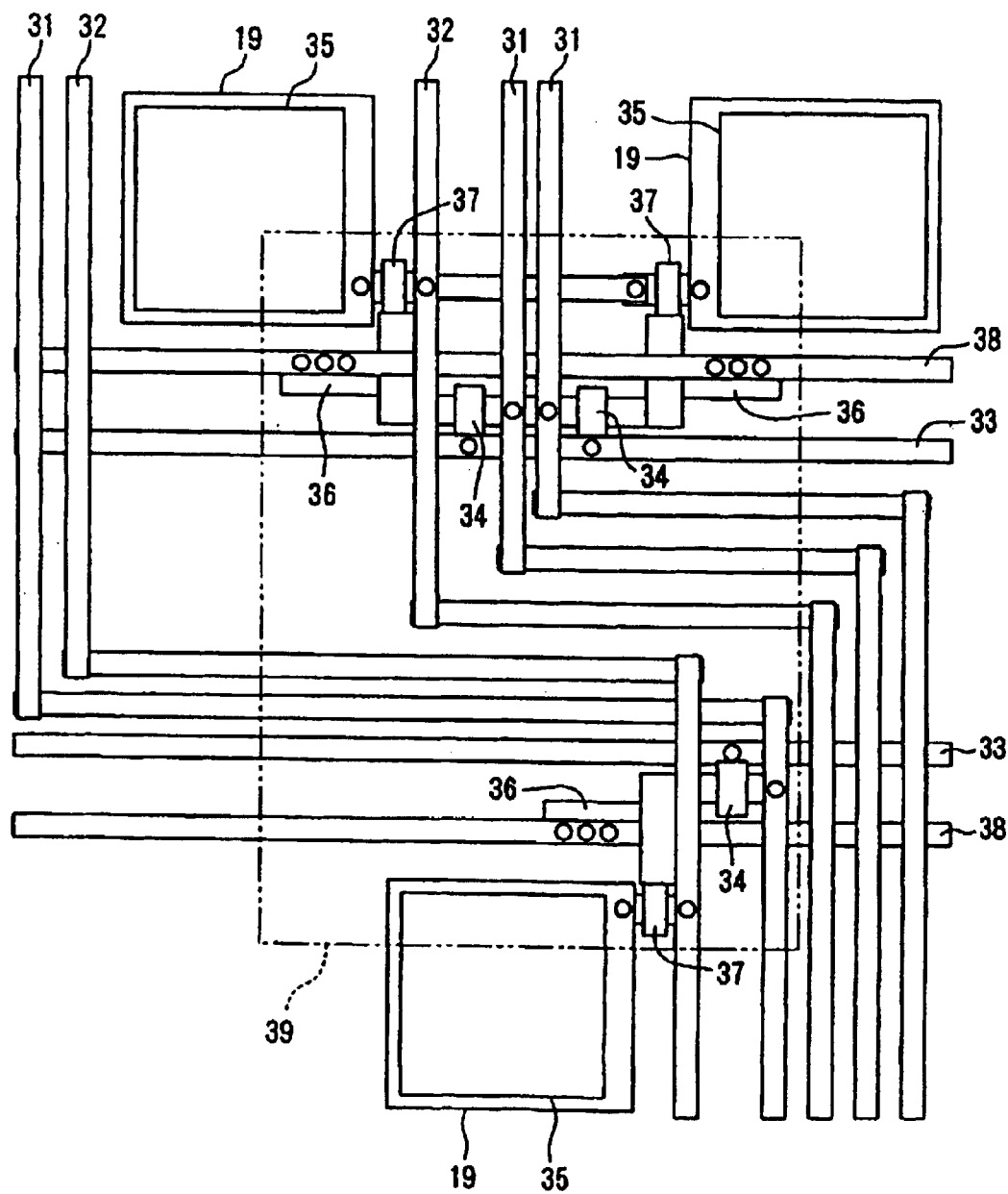
FIG. 14 is a plan view showing one part of an active-matrix type organic EL display wherein one unit block is disposed per three pixels.

In the organic EL display in FIG. 1, although one unit block 39 is arranged per pixel 35, as shown in FIG. 13 and FIG. 14, one unit block 39 can also be arranged per plural pixels 35. In the organic EL display of FIG. 13, one unit block 39 is disposed at the center of four pieces of electrodes for a pixel. In the organic EL display of FIG. 14, one unit block 39 is disposed at the center of three pieces of electrodes for a pixel.

In the organic EL display of FIG. 13, the shape in plan view of unit block 39 is made to be a square, and along four diagonal lines of this square, plural terminals 72a to 72e per four pieces of each organic EL elements are disposed. Terminal 72a is a terminal for signal line 31, terminal 72b is a terminal for scanning line 33, terminal 72c is a terminal for capacity line 38, terminal 72d is a terminal for power supply line 32, and terminal 72e is a terminal for electrode 19 for a pixel. Also, each terminal 72a to 72e on each diagonal line is disposed wherein the distance from the intersecting point from the diagonal line is the same for each corresponding terminal (per terminals 72a to 72e).

Because of this, for example, even if four unit blocks 39 which are disposed at four points on display base board 52 are disposed at such a way that each unit block 39 is disposed at rotated by 90 degrees centered on the center of unit block 39 (intersecting point of diagonal lines), the disposition of each terminal 72a to 72e on the display base board 52 becomes the same. Accordingly, wiring errors can be reduced at the time of forming signal line 31, power supply line 32, scanning line 33 and capacity line 38, etc.

Figure 15:
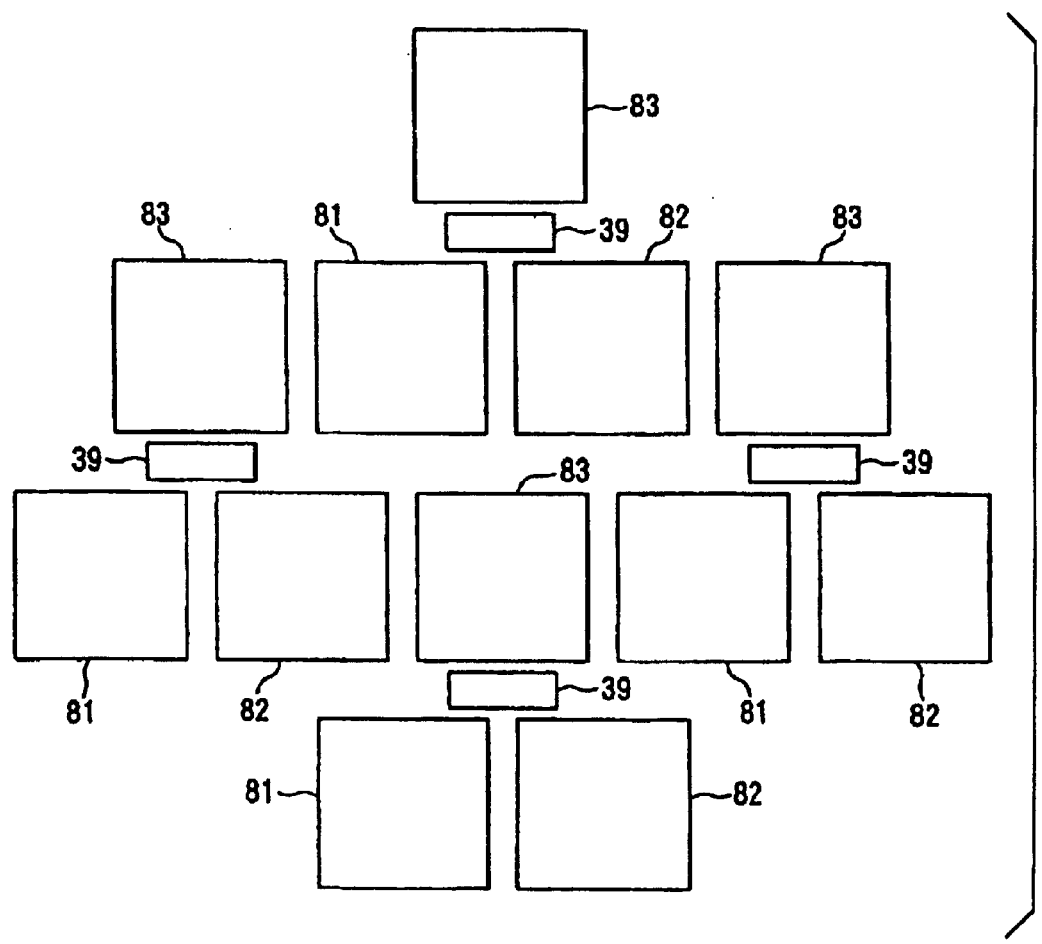
FIG. 15 is a drawing which shows one example of disposing a pixel and a unit block in the case of a color display.

In the case of a color display, as shown in FIG. 15 for example, plural groups, wherein a group is made of pixel 81 which is made of a red color light emitting organic EL element, pixel 82 which is made of a green color light emitting organic EL element, and pixel 83 which is made of a blue color light emitting organic EL element, are disposed on a display base board. Also, each group of unit block 39 for an organic EL element which is made of three pieces of pixel 81 to 83 is disposed at the position which is the center of pixels 81 to 83. If three pixels 35 are pixels 81 to 83, FIG. 14 is equivalent to a drawing showing one group of the display of FIG. 15 and a unit block for these pixels.

Figure 16:
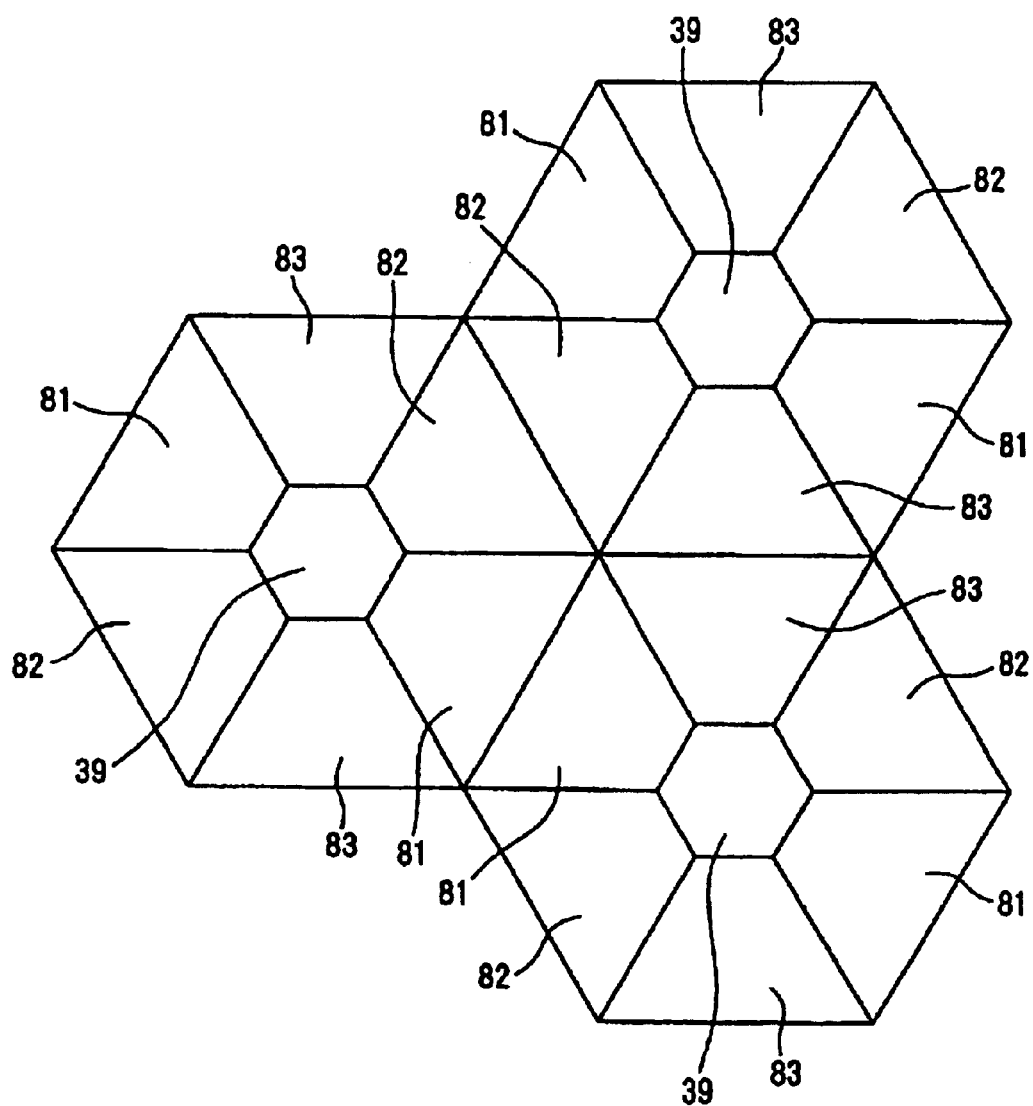
FIG. 16 is a drawing which shows one example of disposing a pixel and a unit block in the case of a color display.

Also, as shown in FIG. 16, each of two of the three pixel 81 to 83, in total 6 pieces, is made to be one group, unit block 39 for the organic EL element which is formed by six pieces of pixel 81 to 83 can be disposed at the center position per each group of 6 pieces of pixels 81 to 83.

In this way, by forming a semiconductor element for plural organic EL elements (pixels) in one unit block, as compared with the case wherein one unit block is formed per one pixel, it is possible to reduce the cost for manufacturing organic EL displays, and to decrease errors in disposition of unit blocks, and to decrease wiring errors.

Additionally, in the above embodiment, although an active-matrix type organic EL display is explained, the method of the present invention which disposes a unit block wherein a semiconductor element is formed in a display base board can also be applied to an organic EL display other than the active-matrix type. Also, the method of the present invention which disposes the unit block wherein a semiconductor element is formed in a display base board can be applied to a semiconductor device such as a memory cell shown in FIG. 17, or to an electro-optic device such as a liquid display, etc., shown in FIG. 18. in addition to the organic EL display. Furthermore, a method of the present invention which disposes a unit block wherein a semiconductor element is formed in a display base board can be applied to many electro-optic devices including self-light-emitting type displays, etc., such as electric migration display device, plasma displays, etc.

Figure 17:
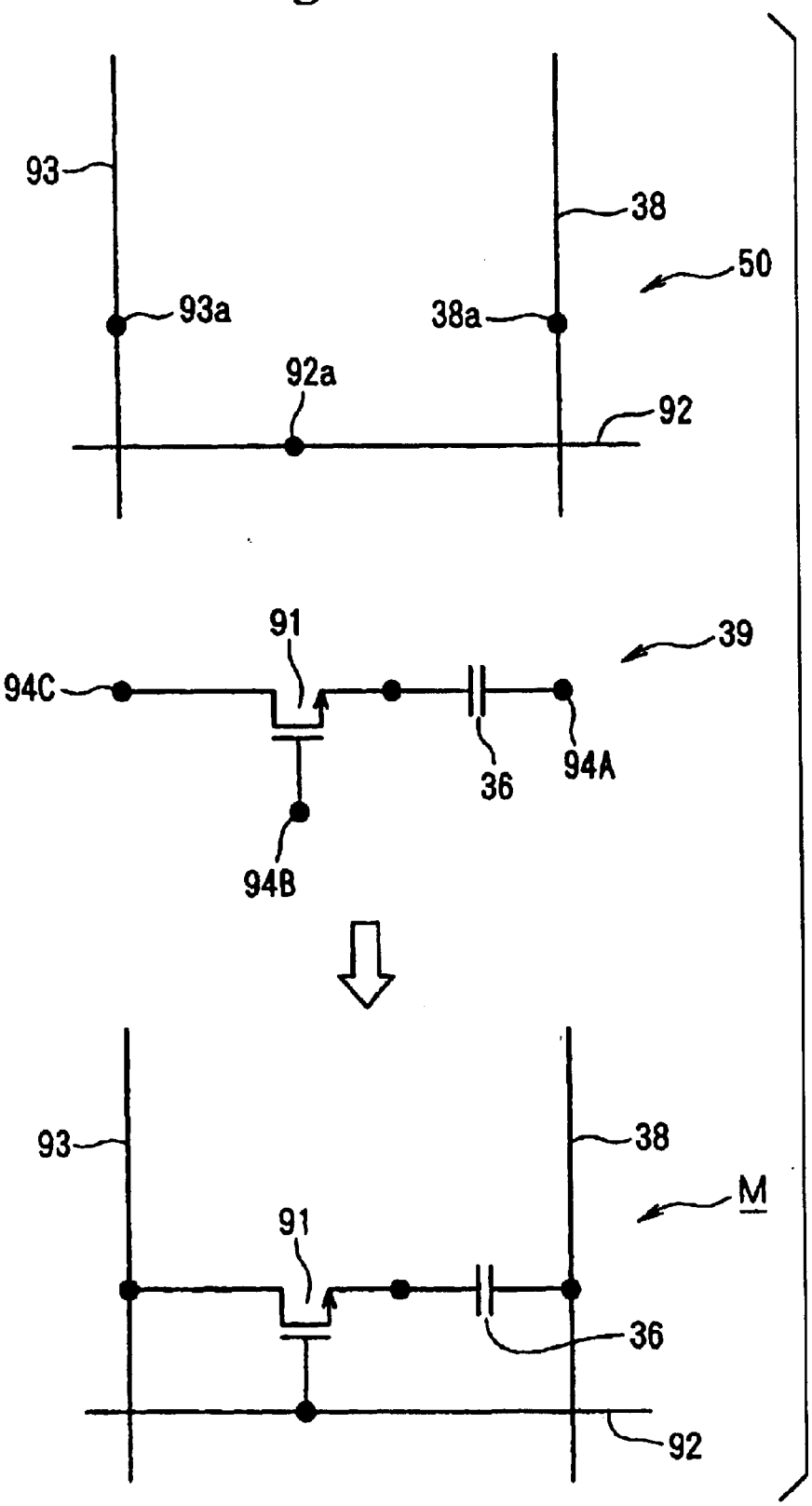
FIG. 17 is a drawing which shows an example of the case wherein the disposing method for a semiconductor element according to an embodiment of the present invention is applied to a memory cell.

As shown in FIG. 17, in a memory cell, by disposing a unit block 39 wherein transistor 91 and capacity 36 are formed on a predetermined base board 50 in place of display base board 52 by any of the methods for of the above FIG. 5 and FIGS. 9 to 12, or by a method wherein these drawings are appropriately combined, memory cell M can be manufactured. Also, if the same method as that of FIG. 8 is adopted, the wiring process after unit block 39 is disposed on base board 50 can be omitted.

In this case, capacity line 38, word line 92, bit line 93, and terminals 38*a*, 92*a*, and 93*a* for connecting with wiring inside unit block 39 of these wiring are formed on base board 50 in advance. In unit block 39, terminals 94A to 94C for connecting with each wiring on display base board 52 is formed in advance at each position which contacts these terminals 38*a*, 92*a*, and 93*a* at the time of disposing on display base board 52.

Figure 18:
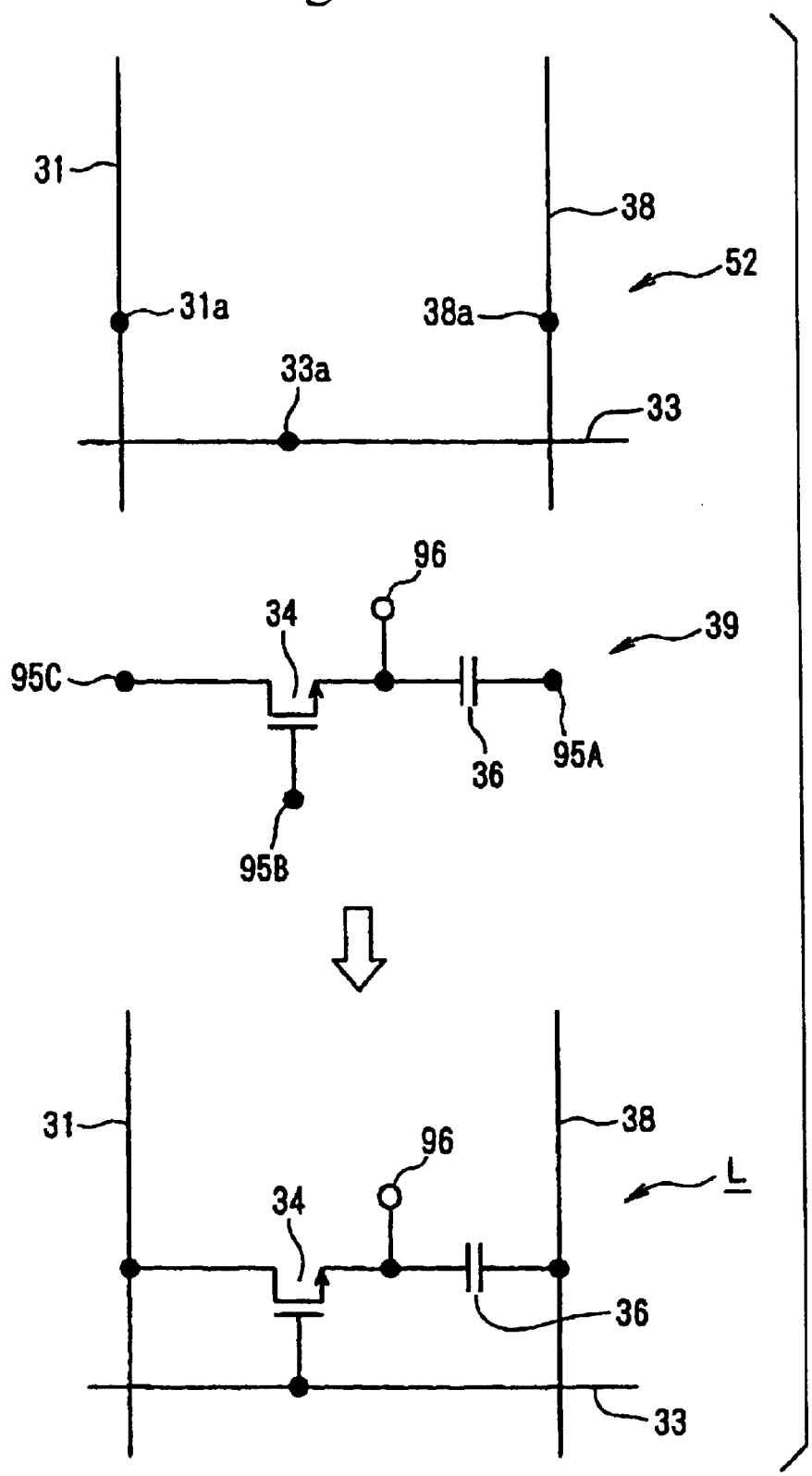
FIG. 18 is a drawing which shows an example of the case wherein the disposing method for a semiconductor element according to an embodiment of the present invention is applied to a liquid display.
Figure 19:
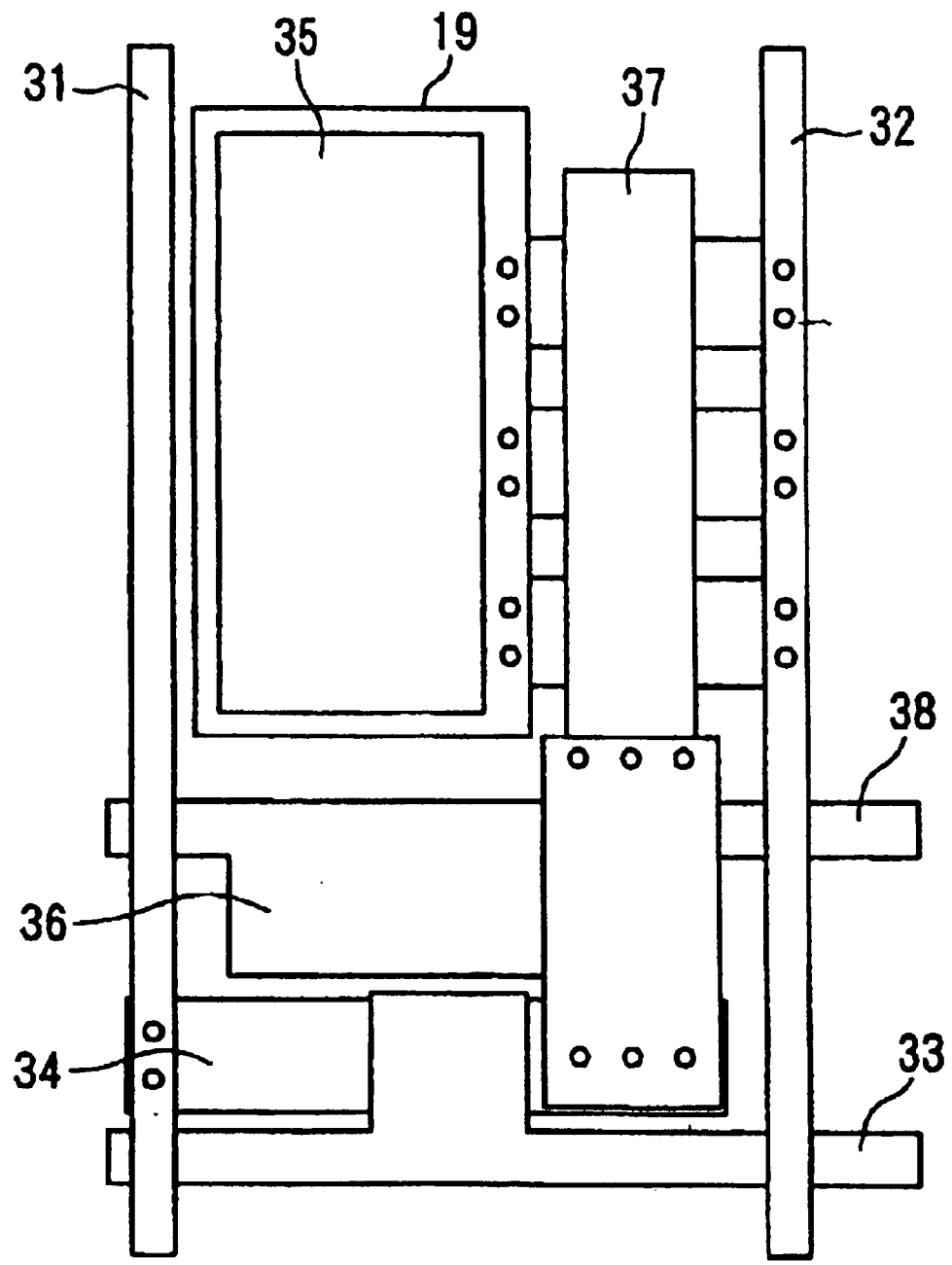
FIG. 19 is a partial plan view which shows one example of a conventional active-matrix type organic EL display.
Figure 20A:
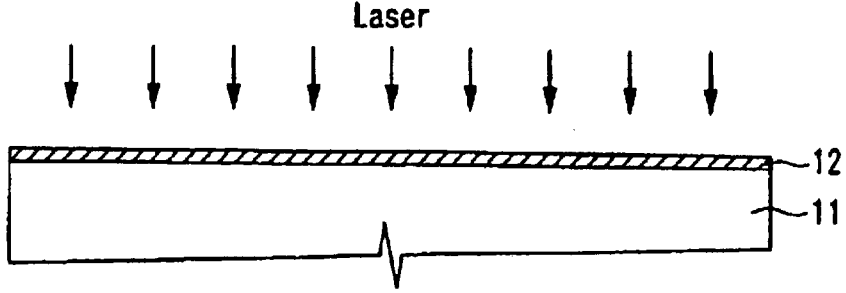
FIG. 20A to FIG. 20D are drawings which explain a forming method for a thin film transistor in which the active layer is a low temperature polyacystal silicon thin film in the manufacturing process of conventional active-matrix type organic EL display.
Figure 20B:
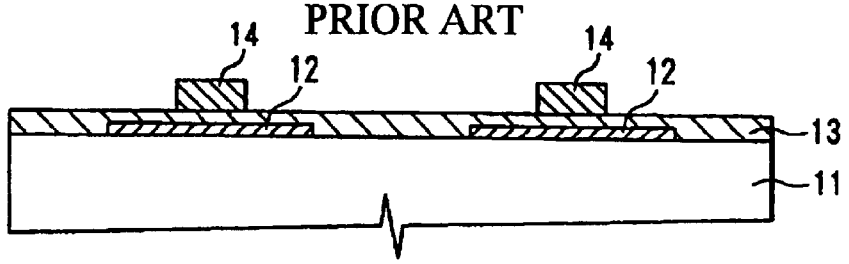
Figure 20C:
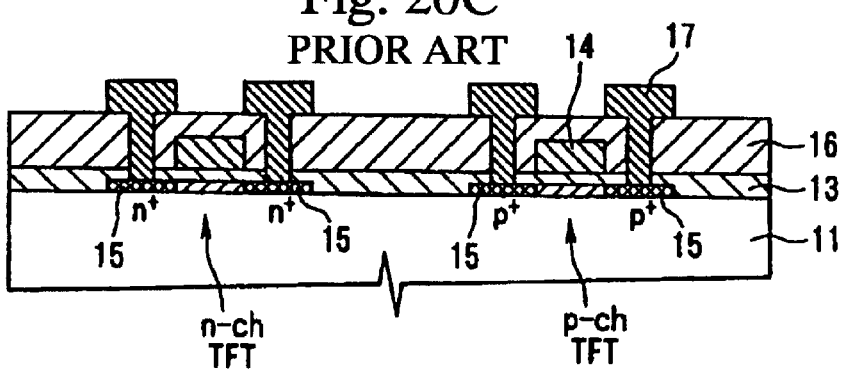
Figure 20D:
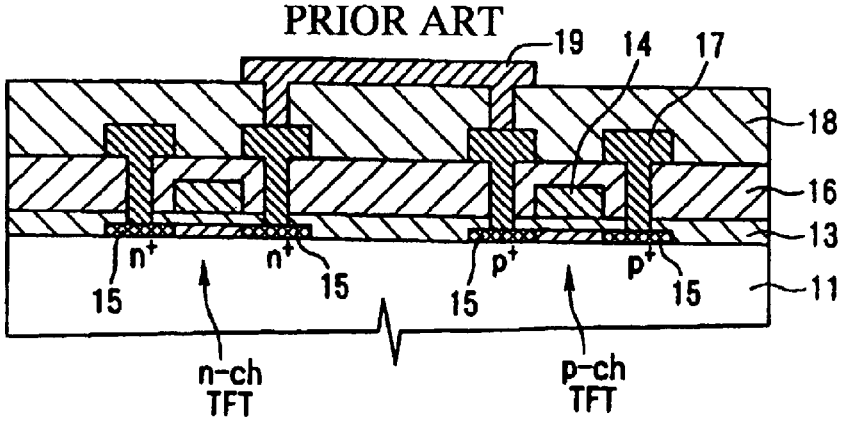
Figure 21A:
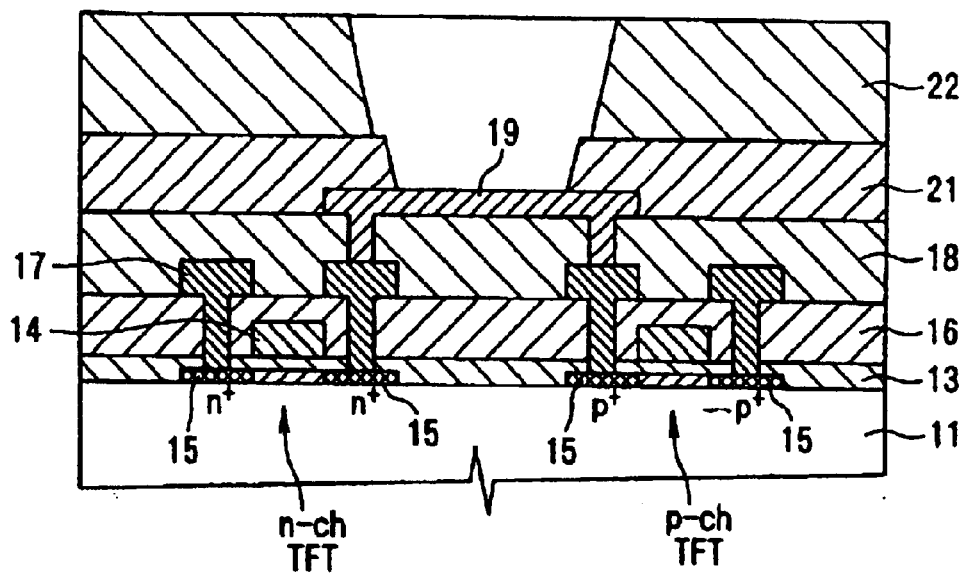
FIG. 21A and FIG. 21B are drawings which explain a forming method for an organic EL element in a manufacturing process for a conventional active-matrix type organic EL display.
Figure 21B:
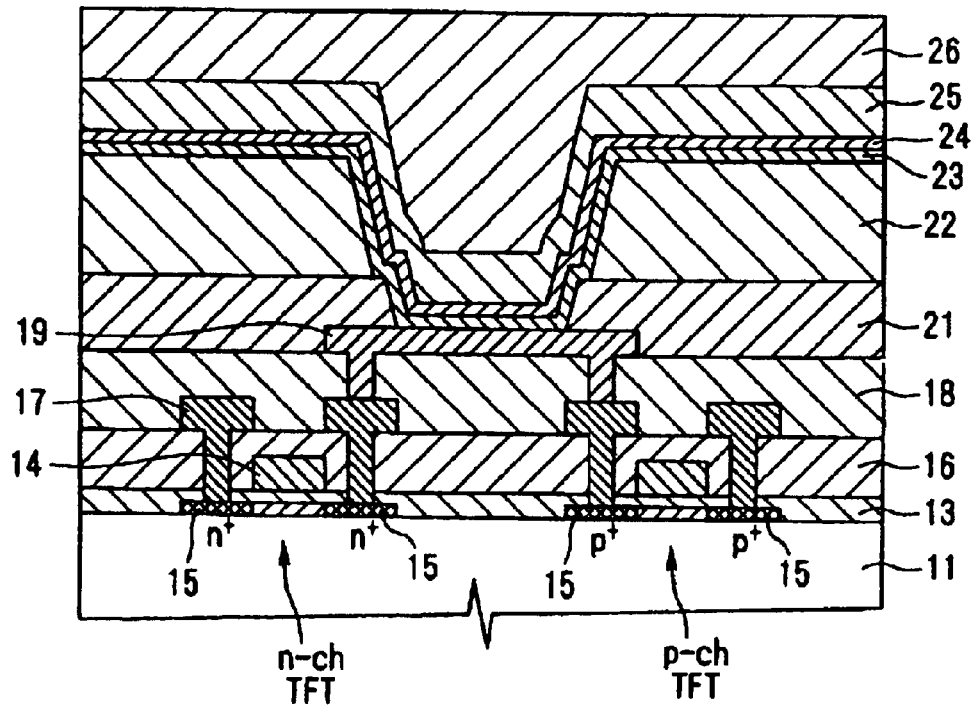
Figure 22A:
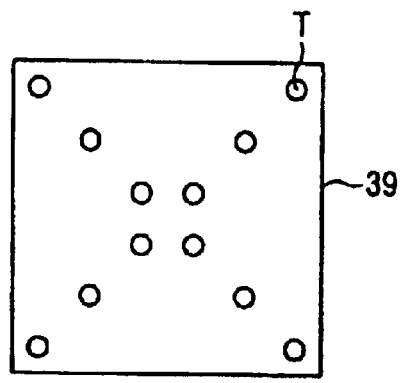
FIG. 22A to FIG. 22F are drawings which shows an example of a disposing method of a terminal against a unit block.
Figure 22B:
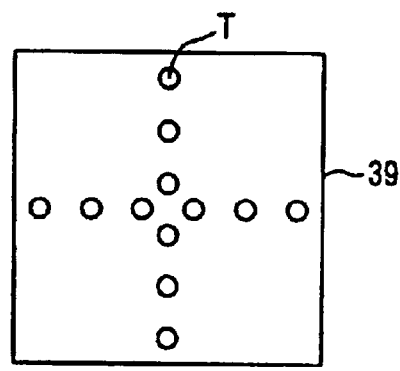
Figure 22C:
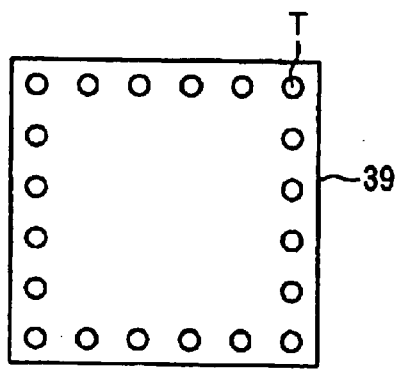
Figure 22D:
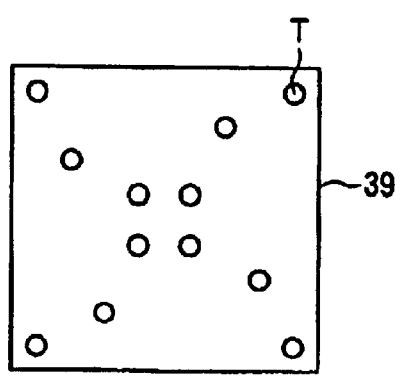
Figure 22E:
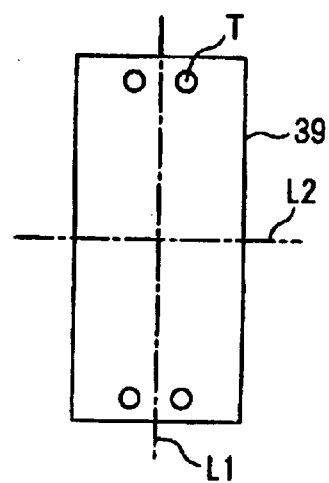
Figure 22F:
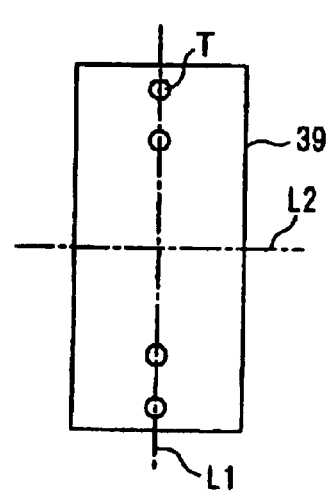

As shown in FIG. 18, in a liquid crystal display, by disposing unit block 39 wherein switching transistor 34 and capacity 36 and terminal 96 for connecting with the liquid crystal element are formed in display base board 52 by any of the methods of FIG. 5 and FIGS. 9 to 12, or by method wherein the methods in these drawings are appropriately combined, liquid crystal display L can be manufactured.

Also, if the same method as in FIG. 8 is adopted, the wiring process after unit block 39 is disposed on base board 50 can be omitted.

In this case, scanning line 33, signal line 31, capacity line 38 and terminals 33*a*, 31*a*, and 38*a* for connecting with wiring inside unit block 39 of these wirings are formed on base board 52 in advance. In unit block 39, terminals 95A to 95C for connecting with each wiring on display base board 52 is formed in advance in each position which contacts these terminals 33*a*, 31*a*, and 38*a* at the time of disposing on display base board 52.

Electronic Device

Next, a few examples in which an active-matrix organic type EL display is used in specific electronic devices as an example of above electro-optic device are explained.

1. :Mobile Type Computer

First, an example in which an organic EL display according to this embodiment is applied to a mobile type personal computer is explained. FIG. 23 is a perspective view which shows the construction of this personal computer. In the drawing, personal computer 1100 is formed by main body part 1104 which is provided with keyboard 1102, and display unit 1106. Display unit 1106 has organic EL display panel 100.

2. :Mobile Telephone

Next, an example in which an organic EL display is applied to a display part of a mobile telephone is explained. FIG. 24 is a perspective view which shows the construction of this mobile telephone. In the drawing, mobile telephone 1200 is provided with an earpiece 1204, mouthpiece 1206, and the above organic EL display panel 100 in addition to plural operation button 1202.

3. :Digital Still Camera

Furthermore, a digital still camera in which an organic EL display is used in a finder is explained. Although FIG. 25 is a perspective view which shows the construction of this digital still camera, FIG. 25 also schematically shows the connection to an external device.

An ordinary camera exposes film to an optical image of a subject; in contrast, a digital still camera 1300 generates an image pick-up signal by electro-optically transforming the optical image of a subject by an image pick-up element such as a CCD (Charge Coupled Device). Here, in the back face of case 1302 in digital still camera 1300, the above organic EL display panel 100 is arranged, and this digital still camera is formed so as to display based on an image pick-up signal by the CCD. Therefore, the organic EL display panel 100 functions as a finder which displays a subject. Also, on the observation side of case 1302 (back face side in the drawing), light receiving unit 1304 which includes an optical lens and a CCD, etc., is arranged.

Here, when a photographer depresses shutter button 1306 after confirming the image of a subject displayed on the organic EL display panel 100, an image pick-up signal of a CCD at that time is transmitted and stored in the memory of circuit base board 1308. Also, in this digital still camera 1300, video signal output terminal 1312 and input-output terminal 1314 for data communication are arranged on the side face of case 1302. Additionally, as shown in the drawing, television monitor 1430 is connected to the video signal output terminal 1312 as a former one according to necessity, and also personal computer 1430 is connected to input-output terminal 1314 as a latter one according to necessity. Furthermore, the construction is in such a way that an image pick-up signal which is stored in the memory of circuit base board 1308 is output to television monitor 1430 and personal computer 1440 by a predetermined operation.

Figure 25:
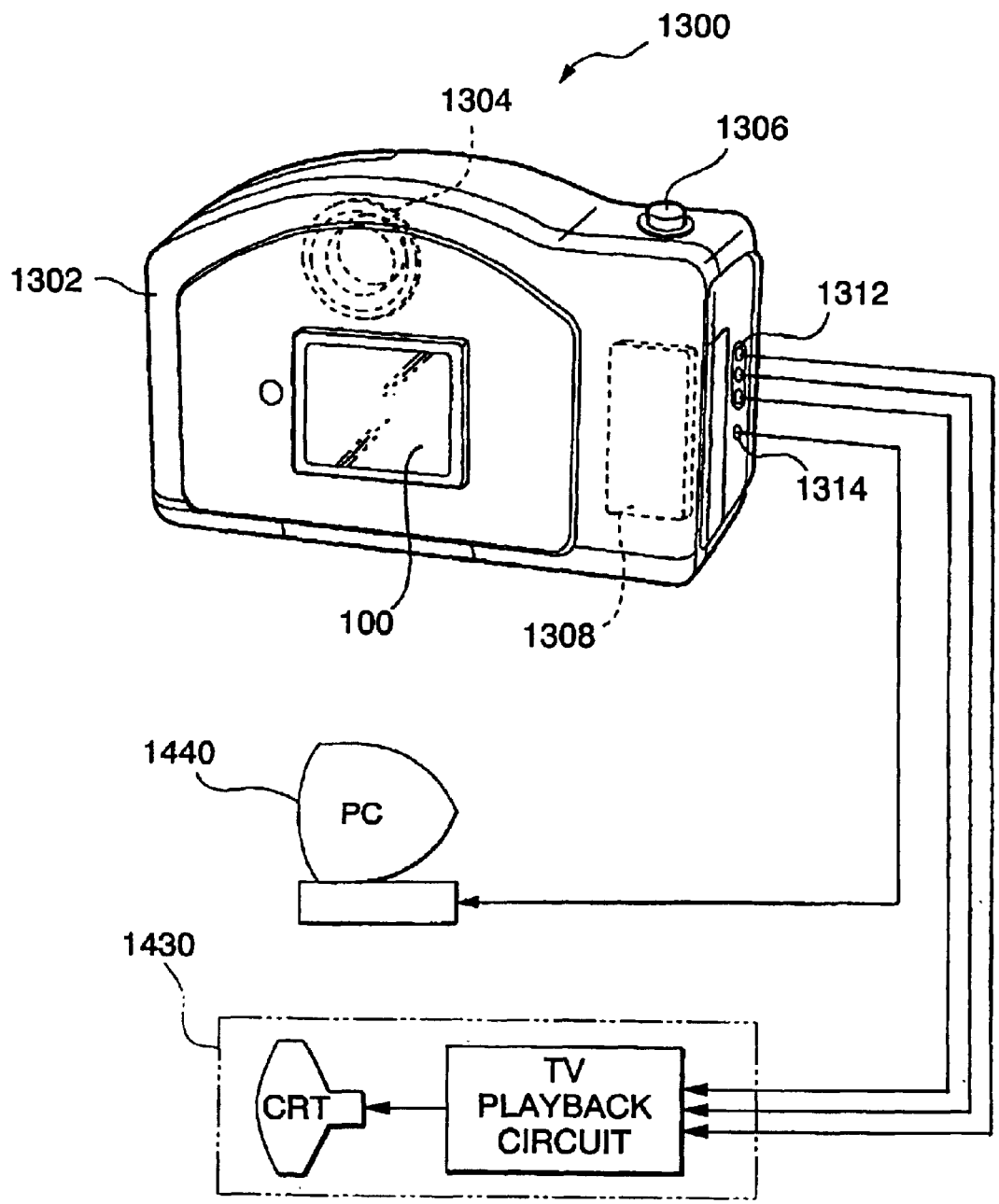
FIG. 25 is a perspective view which shows the construction of the back side of digital still camera as one example of same electronic device.

Additionally, as an electronic device, in addition to the personal computer of FIG. 23 and mobile telephone of FIG. 24 and digital still camera of FIG. 25, a liquid crystal television, view-finder type videotape recorder, direct monitor type videotape recorder, automobile navigation device, pager, PDA (Personal Data Assistant), calculator, word processor, work station, picture telephone, POS (Point-of-Sale) terminal, and devices which are provided with touch panels, etc., can be mentioned. As the display part of each electronic device, above display device can be used.

What is claimed is:

1. A manufacturing method for an organic EL display which is provided with a semiconductor element for driving an organic EL element for a pixel or a plurality of pixels, comprising the steps of:

disposing a plurality of unit blocks having said semiconductor element on a first base board;

disposing each unit block on a second base board such that each unit block corresponds to the pixel or the plurality of pixels formed thereon, having a hole therein.

2. A manufacturing method for an organic EL display, which is provided with a semiconductor element for driving an organic EL element for a pixel or a plurality of pixels, comprising the steps of:

disposing a plurality of unit blocks having said semiconductor element on a first base board, which is composed of a single crystalline semiconductor;

dicing the first base board so as to be divided per unit block; and disposing each unit block on a second base board, such that each unit block corresponds to the pixel or the plurality of pixels formed thereon, having a hole therein.

3. A manufacturing method for an organic EL display according to claim 1 comprising the steps of:

a concavity having a shape of the unit block being formed such that each unit block corresponds to the pixel or the plurality of pixels formed on the second base board; and disposing each unit block at a position where the concavity is formed in a liquid.

4. A manufacturing method for an organic EL display according to claim 1 comprising the steps of:

a hole which penetrates in a thickness direction through the second base board being formed such that each unit block corresponds to the pixel or the plurality of pixels formed on the second base board;

introducing the unit block to a position of said hole on one face of the second base board by making a pressure at the one face of the second base board higher than a pressure at the other face, or by drawing a liquid into said hole, the unit block being disposed at the position of said hole on the second base board.

5. A manufacturing method for an organic EL display according to claim 4 wiring being performed by using said hole.

6. A manufacturing method for an organic EL display according to claim 1 the unit block being introduced to be disposed by Coulomb attractive force such that each unit block corresponds to the pixel or the plurality of pixels formed thereon.

7. A manufacturing method for an organic EL display according to claim 1 characterized in disposing materials for an organic EL element for a pixel or a plurality of pixels on the second base board by an ink jet method.

8. A manufacturing method for an organic EL display according to claim 1 characterized in forming wiring above the second base board by an ink jet method.

9. A manufacturing method for an organic EL display according to claim 1 wherein the driving method is active-matrix method.

10. Manufacturing method for an organic EL display which is provided with a semiconductor element for driving an organic EL element for a pixel or a plurality of the pixels, comprising the steps of:

disposing a plurality of unit blocks having said semiconductor element and first connecting terminals which are connected to the semiconductor element on a first base board;

disposing wirings and second connecting terminals above a second base board; and disposing each unit block on the second base board such that each unit block corresponds to the pixel or the plurality of pixels formed on the second base board and the first connecting terminals which are disposed on the unit block are connected with the second connecting terminals which are disposed on the second base board, having a hold therein.

11. Manufacturing method for an organic EL display according to claim 10 the unit blocks having plural semiconductor elements for driving plural neighboring organic EL elements, a planar shape of the unit block is polygonal and the first connecting terminals are rotationally symmetrically centered at a center of the polygon, and a number of corners of the polygon corresponds to a number of the semiconductors formed on the unit block.

12. Manufacturing method for a organic EL display according to claim 10 the unit blocks having plural semiconductor elements for driving plural neighboring organic EL elements, and a planar shape of the unit blocks being rectangular, the first connecting terminals are disposed so as to be axis symmetric with respect to center lines which are parallel with a longer side of the rectangle or a shorter side of the rectangle.

13. Manufacturing method for an organic EL display according to claim 10 the unit block having plural semiconductor elements for driving plural neighboring organic EL elements, and a planar shape of the unit block is polygonal and the first connecting terminals are disposed along diagonal lines of the polygon, and a position of the first terminals on the diagonal lines being such that the first connecting terminals are connected to the same wiring when the unit block is disposed on the second base board and the wiring is formed.

14. Manufacturing method for an organic EL display according to claim 11 said polygon being an equilateral polygon.

15. Manufacturing method for an organic EL display according to claim 13 said polygon being an equilateral polygon.

16. A manufacturing method for an organic EL display, which is provided with an organic EL element and a semiconductor element for driving the organic EL element for a pixel or a plurality of the pixels, comprising the steps of:

disposing each unit block on a base board such that each unit block corresponds to the pixel or the plurality of pixels formed on the base board, having a hold therein, each unit block having 3 semiconductor elements for driving 3 neighboring organic EL elements, plural groups of organic EL elements made of 3 pieces of neighboring organic EL elements such as red color light emitting, blue color light emitting, green color light emitting being disposed on the base board, and each of the semiconductor elements for driving 3 pieces of neighboring organic EL elements being disposed at a position which is centered relative to the 3 pieces of neighboring organic EL element per group.

17. A manufacturing method for an organic EL display, which is provided with an organic EL element and a semiconductor element for driving the organic EL element for a pixel or a plurality of pixels, comprising the steps of:

disposing each unit block on a base board such that each unit block corresponds to the pixel or the plurality of pixels formed on the base board, having a hole therein, the unit block having plural semiconductor elements for driving plural neighboring organic EL elements, and plural groups of organic EL elements made of 6 pieces of neighboring organic EL elements such as 2 pieces of red color light emitting, 2 pieces of blue color light emitting, 2 pieces of green color light emitting being disposed on the base board, each unit block having semiconductor elements for driving 6 pieces of neighboring organic EL elements being disposed at a position which is centered relative to the 6 pieces of neighboring organic EL element per group.

18. A disposing method for a semiconductor element in which a unit block having a semiconductor element is disposed at a predetermined position on a base board, the disposing method for a semiconductor element characterized in that by arranging a hole, which penetrates in a thickness direction through the base board and by making a pressure at one face of the base board higher than a pressure at the other face, or by drawing a liquid into said hole, the unit block being disposed at a position of the hole on the base board so as to introduce the unit block to the position of said hole on one face of the base board.

19. A disposing method for a semiconductor element in which a unit block having a semiconductor element is disposed at a predetermined position on a base board, comprising the steps of:

disposing a plurality of unit blocks having said semiconductor element and first connecting terminals which are connected to the semiconductor element on a first base board;

disposing wirings and second connecting terminals above a second base board;

disposing each unit block on the second base board at a predetermined position so as to connect the first connecting terminals which are disposed on the unit block with the second connecting terminals which are disposed on the second base board, having a hole therein.

20. A manufacturing method for a semiconductor device having a process in which a unit block having plural semiconductor elements is disposed at a predetermined position on a first base board, a planar shape of the unit block is polygonal and first connecting terminals are disposed along diagonal lines of the polygon, and a position of the first terminals on the diagonal lines being such that the first connecting terminals are connected to the same wiring when the unit block is disposed on a second base board, having a hole therein.

21. A manufacturing method for an organic EL display according to claim 20 said polygon being an equilateral polygon.

22. A manufacturing method for an electro-optic device which is provided with a semiconductor element for driving an organic electro-optic for a pixel or a plurality of pixels, comprising the steps of:

disposing a plurality of unit blocks having said semiconductor element on a first base board;

disposing each unit block, which is formed on the first base board, on a second base board, having a hole therein such that each unit block corresponds to the pixel or the plurality of pixels formed thereon.

23. Manufacturing method for an organic EL display according to claim 10 wherein the wirings are a scanning line, a signal line, and a power supply line.

24. A manufacturing method for an organic EL display according to claim 2 wherein the driving method is active-matrix method.

25. A manufacturing method for an organic EL display according to claim 10 wherein the driving method is active-matrix method.

* * * * *